(12) United States Patent
Inaba et al.

(10) Patent No.: US 11,100,988 B2
(45) Date of Patent: Aug. 24, 2021

(54) SEMICONDUCTOR MEMORY DEVICE

(71) Applicant: Kioxia Corporation, Tokyo (JP)

(72) Inventors: Tsuneo Inaba, Kamakura Kanagawa (JP); Hiroyuki Takenaka, Kamakura Kanagawa (JP); Akihiko Chiba, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/016,185

(22) Filed: Sep. 9, 2020

(65) Prior Publication Data

US 2021/0174870 A1 Jun. 10, 2021

(30) Foreign Application Priority Data

Dec. 4, 2019 (JP) .............................. JP2019-219569

(51) Int. Cl.
*G11C 13/00* (2006.01)
*H01L 27/24* (2006.01)

(52) U.S. Cl.
CPC ........ *G11C 13/0038* (2013.01); *G11C 13/004* (2013.01); *G11C 13/0026* (2013.01); *G11C 13/0028* (2013.01); *G11C 13/0069* (2013.01); *H01L 27/2481* (2013.01)

(58) Field of Classification Search
CPC .............. G11C 13/0038; G11C 13/004; G11C 13/0028; G11C 13/0026; G11C 13/0069; H01L 27/2481
See application file for complete search history.

(56) References Cited

U.S. PATENT DOCUMENTS

| 7,615,447 | B2 * | 11/2009 | Purayath | ........... H01L 27/11521 |
| | | | | 257/315 |
| 7,807,529 | B2 * | 10/2010 | Purayath | ........... H01L 27/11524 |
| | | | | 438/257 |
| 7,888,210 | B2 * | 2/2011 | Purayath | ........... H01L 27/11524 |
| | | | | 438/266 |
| 8,045,363 | B2 | 10/2011 | Kim | |
| 8,148,763 | B2 * | 4/2012 | Kim | ........................ G11C 5/02 |
| | | | | 257/296 |
| 8,270,193 | B2 | 9/2012 | Siau et al. | |
| 8,391,065 | B2 * | 3/2013 | Noguchi | ................ G11C 16/08 |
| | | | | 365/185.05 |
| 8,395,922 | B2 * | 3/2013 | Noguchi | ................ G11C 16/26 |
| | | | | 365/63 |
| 8,546,152 | B2 * | 10/2013 | Orimoto | ................ H01L 22/26 |
| | | | | 438/8 |
| 9,042,161 | B2 * | 5/2015 | Koyama | ............... G11C 11/404 |
| | | | | 365/149 |
| 9,159,424 | B2 * | 10/2015 | Aritome | ............ G11C 16/3427 |
| 9,368,199 | B2 * | 6/2016 | Miyakawa | ............ G11C 11/165 |

(Continued)

*Primary Examiner* — Tri M Hoang
(74) *Attorney, Agent, or Firm* — Holtz, Holtz & Volek PC

(57) ABSTRACT

According to one embodiment, a semiconductor memory device includes the following configuration. First Lower word line drivers are arranged between adjacent mats, and first upper word line drivers are arranged between the first Lower word line drivers. Second Lower word line drivers are arranged between another adjacent mats, and second upper word line drivers are arranged between the second lower word line drivers. The first and second upper word line drivers are shared by the adjacent mats respectively.

16 Claims, 19 Drawing Sheets

(56) References Cited

U.S. PATENT DOCUMENTS

| | | | |
|---|---|---|---|
| 9,391,269 B2 * | 7/2016 | Lee | H01L 45/1233 |
| 9,646,688 B2 | 5/2017 | Scheuerlein | |
| 9,672,917 B1 * | 6/2017 | Costa | G11C 16/0483 |
| 9,773,804 B2 * | 9/2017 | Lee | H01L 27/11556 |
| 10,998,301 B2 * | 5/2021 | Kanamori | H01L 27/11582 |
| 2020/0365560 A1 * | 11/2020 | Kanamori | H01L 25/18 |
| 2021/0012828 A1 * | 1/2021 | Kim | G11C 11/4085 |

* cited by examiner

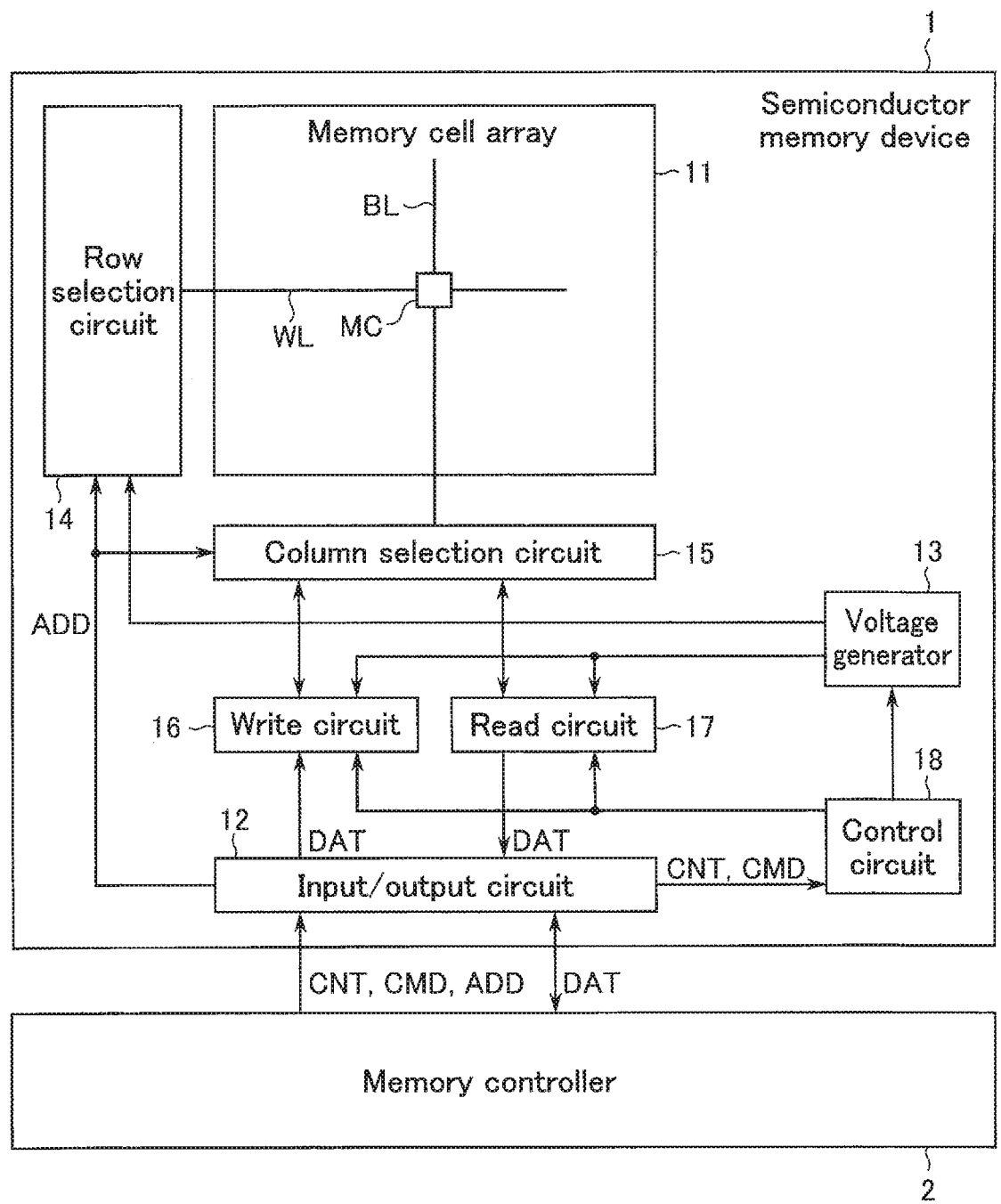
F I G. 1

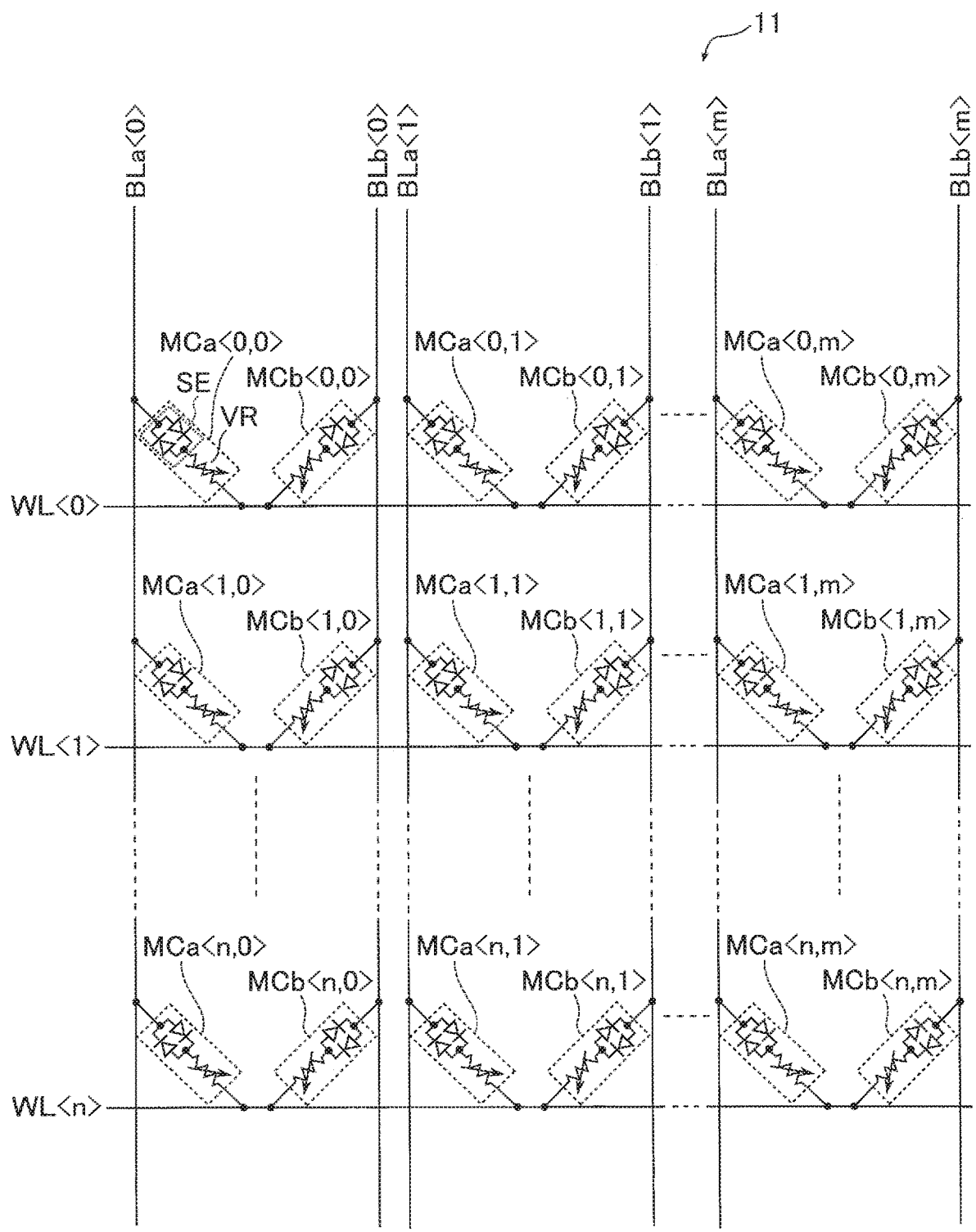
F I G. 2B

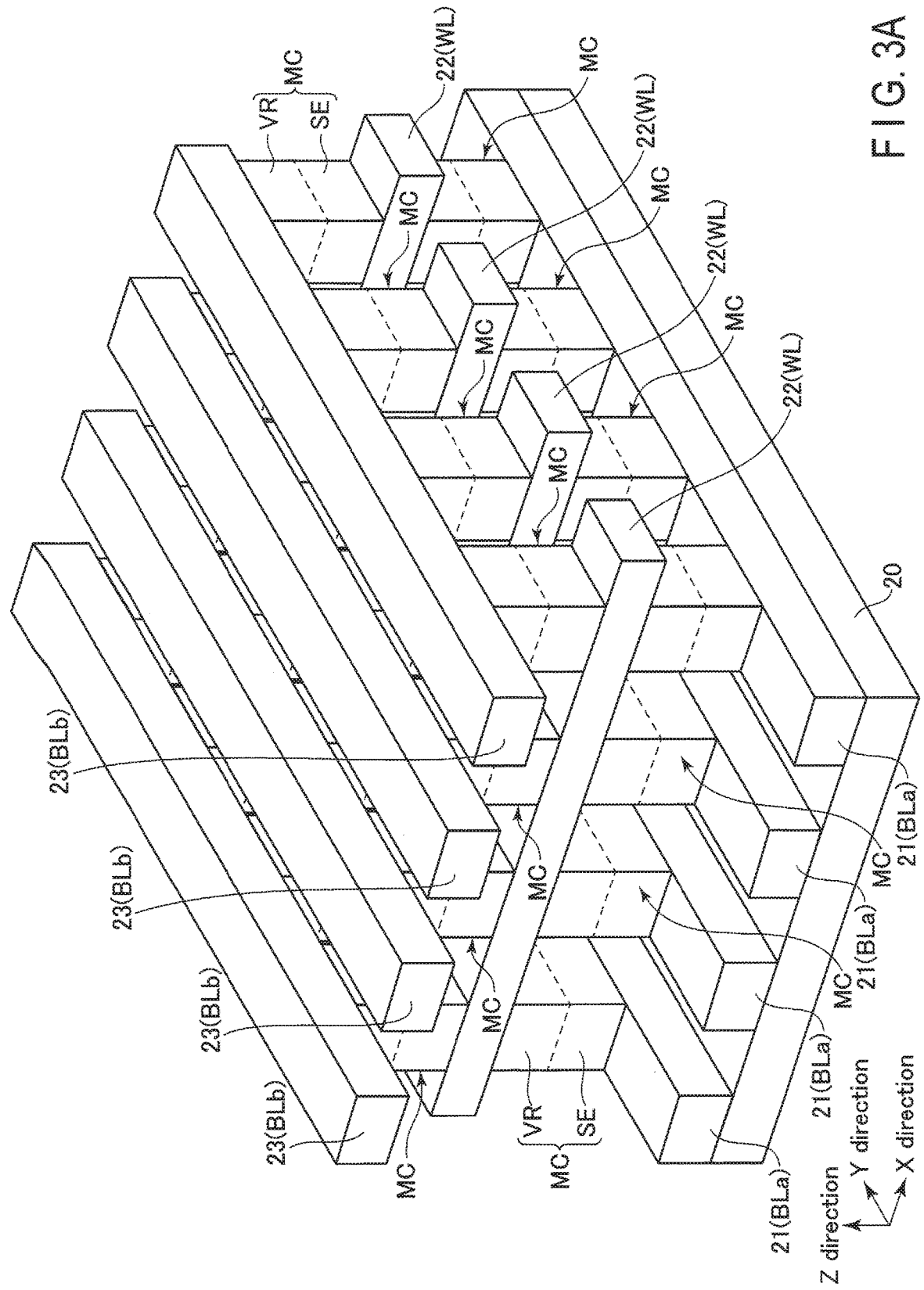
F I G. 3A

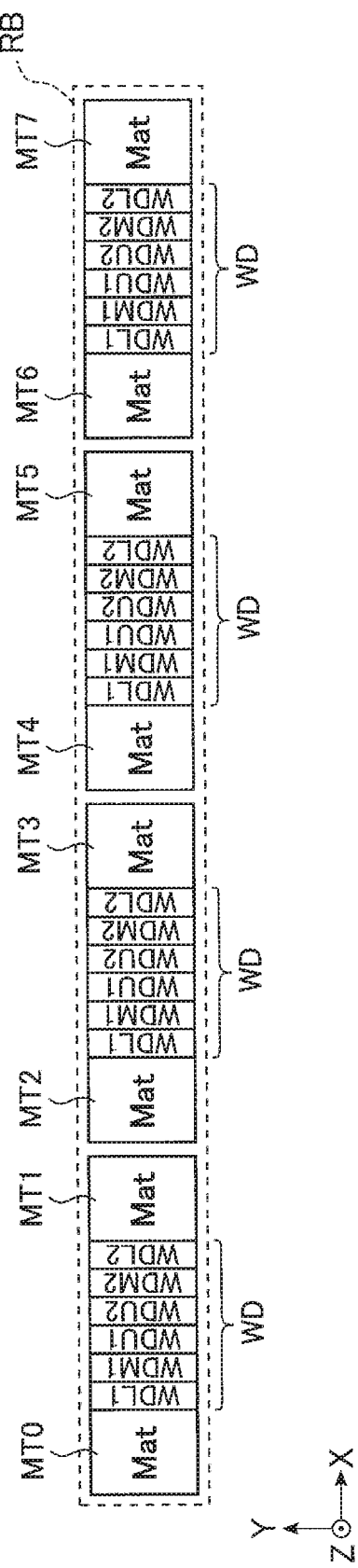
F I G. 14

SEMICONDUCTOR MEMORY DEVICE

CROSS-REFERENCE TO RELATED APPLICATIONS

This application is based upon and claims the benefit of priority from the Japanese Patent Application No. 2019-219569, filed Dec. 4, 2019, the entire contents of which are incorporated herein by reference.

FIELD

Embodiments described herein relate generally to a semiconductor memory device.

BACKGROUND

As a type of semiconductor memory device, a resistance change type memory, for example a ReRAM (resistive random access memory), is known. Memory cells included in a ReRAM have resistance change layers in which resistance values change upon application of a voltage. By stacking the memory cells of the ReRAM into a three-dimensional structure, it is expected that the ReRAM will be highly integrated and reduced in cost.

BRIEF DESCRIPTION OF THE DRAWINGS

FIG. 1 is a block diagram showing a circuit configuration of a semiconductor memory device according to a first embodiment.

FIG. 2B is a diagram showing another example of a circuit configuration of a part of the memory cell array according to the first embodiment.

FIG. 3A is a perspective view schematically showing an example of a structure of a part of the memory cell array according to the first embodiment.

FIG. 14 is a drawing showing an example of an arrangement of mats and word line drivers in a second embodiment.

DETAILED DESCRIPTION

Figure 2A:
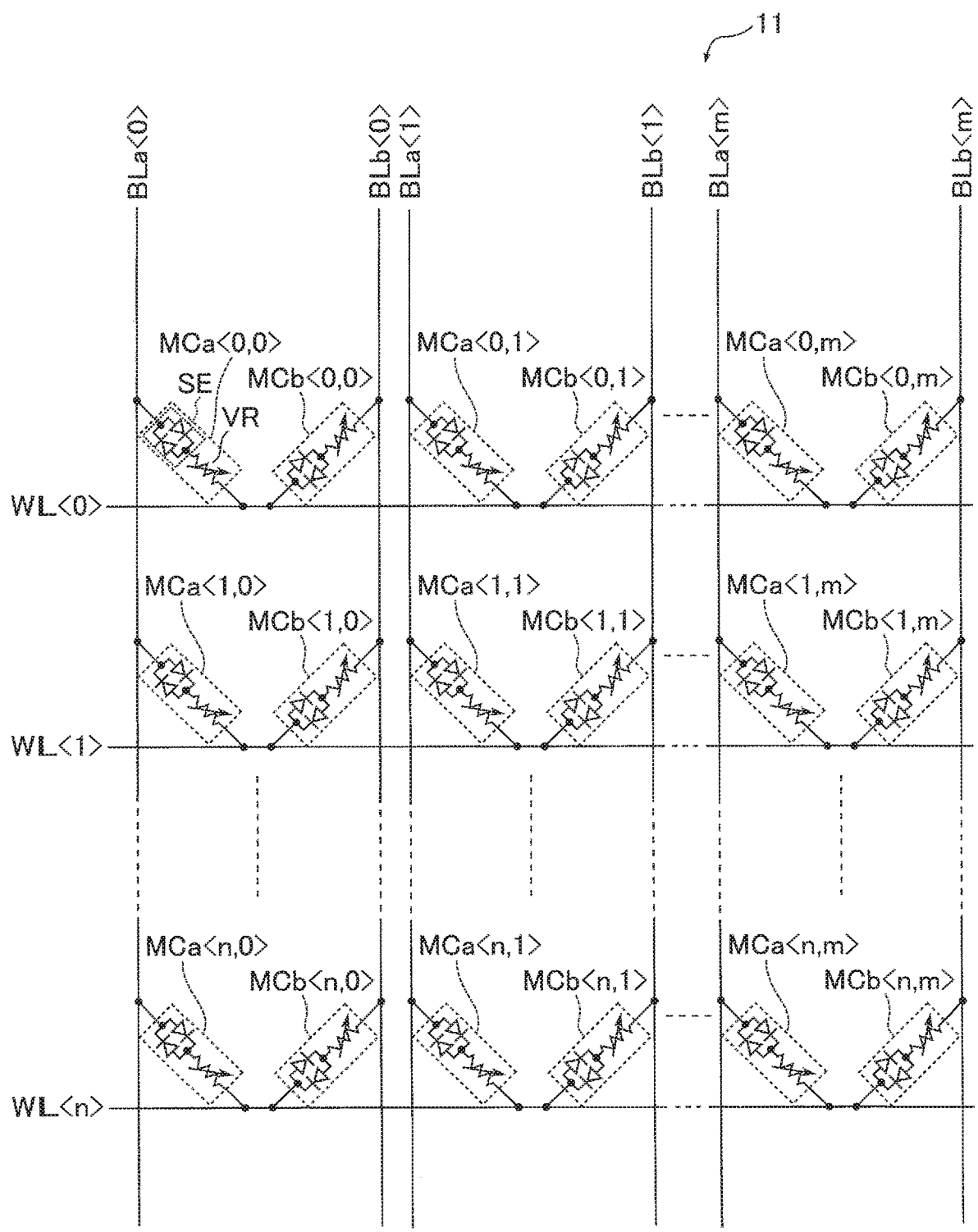
FIG. 2A is a diagram showing an example of a circuit configuration of a part of a memory cell array according to the first embodiment.

In general, according to one embodiment, a semiconductor memory device includes a substrate including a main surface extending in a first direction and a second direction, that intersects the first direction; a first memory cell array including a first conductive layer, a second conductive layer, a third conductive layer, a first memory cell, and a second memory cell; a second memory cell array including a fourth conductive layer, a fifth conductive layer, a sixth conductive layer, a third memory cell, and a fourth memory cell; a first driver that applies a voltage to the first conductive layer and the fourth conductive layer; a second driver that applies a voltage to the third conductive layer and the sixth conductive layer; a first connection arranged between the first memory cell array and the second memory cell array with respect to the first direction, and extending in the third direction, the first connection electrically coupling the first conductive layer and the fourth conductive layer to the first driver; and a second connection arranged between the first memory cell array and the second memory cell array with respect to the first direction, and extending in the third direction, the second connection electrically coupling the third conductive layer and the sixth conductive layer to the second driver.

The first conductive layer is arranged on one side of a third direction that intersects the first direction and the second direction of the substrate, and extends in the first direction. The second conductive layer is arranged on the one side of the third direction of the first conductive layer and extends in the second direction. The third conductive layer is arranged on the one side of the third direction of the second conductive layer and extends in the first direction. The first memory cell is arranged between the first conductive layer and the second conductive layer with respect to the third direction. The second memory cell is arranged between the second conductive layer and the third conductive layer with respect to the third direction. The fourth conductive layer is arranged on the one side of the third direction of the substrate and extends in the first direction. The fifth conductive layer is arranged on the one side of the third direction of the fourth conductive layer and extends in the second direction. The sixth conductive layer is arranged on the one side of the third direction of the fifth conductive layer extends in the first direction. The third memory cell is arranged between the fourth conductive layer and the fifth conductive layer with respect to the third direction. The fourth memory cell is arranged between the fifth conductive layer and the sixth conductive layer with respect to the third direction.

Hereinafter, embodiments will be described with reference to the drawings. In the descriptions below, constituent elements having the same functions and configurations will be denoted by the same reference symbols. The embodiments to be described below are shown as an example of a device or a method for embodying the technical idea of the embodiments, and are not intended to limit the material, shape, structure, arrangement, etc. of components to those described below. Furthermore, if possible, two or more of the embodiments may be combined and configured as one embodiment.

Each of the function blocks (or circuit, blocks) can be implemented in the form of hardware, software, or a combination thereof. The function blocks do not have to be categorized as in the example described below. For example, some of the functions may be implemented by a function block other than the exemplary function blocks. In addition, the exemplary function blocks may be further divided into function sub-blocks.

1. First Embodiment

A semiconductor memory device according to a first embodiment will be described. First, a circuit configuration and a structure of a memory cell array will be described, and then an arrangement of word line drivers that drive word lines coupled to memory cells and bit line drivers that drive bit lines, which is one of main features of the present embodiment, will be described.

1.1 Circuit Configuration

First, the circuit configuration of the semiconductor memory device according to the first embodiment is described.

1.1.1 Circuit Block Configuration of Semiconductor Memory Device

FIG. 1 is a block diagram showing a circuit configuration of the semiconductor memory device according to the first embodiment. As shown in FIG. 1, the semiconductor memory device 1 includes a memory cell array 11, an input/output circuit 12, a voltage generator 13, a row selection circuit 14, a column selection circuit 15, a write circuit 16, a read circuit 17, and a control circuit 18. Outside of the semiconductor memory device 1, a memory controller 2 that controls the semiconductor memory device 1 is provided, for example.

The memory cell array 11 includes a plurality of memory cells MC, a plurality of word lines WL, and a plurality of bit lines BL. Each memory cell MC is arranged between a word line WL and a bit line BL, in other words, at a location where a bit line BL intersects with a word line WL. Each memory cell MC is coupled to a single word line WL and a single bit line.

The word lines WL are associated with respective rows. The bit lines are associated with respective columns. One or more memory cells MC are specified by selecting a single row and a single or multiple columns. The memory cells MC are capable of storing data in a nonvolatile manner.

The input/output circuit 12 receives, for example, various control signals CNT, various commands CMD, an address signal ADD, and data (write data) DAT from the memory controller 2. The input/output circuit 12 sends data (read data) DAT to the memory controller 2.

The voltage generator 13 generates voltages for various types of operations at the memory cell array 11, using a power supply voltage provided by for example an external device. For example, the voltage generator 13 generates various voltages used in a write operation, and supplies the voltages to the row selection circuit 14 and the write circuit 16. The voltage generator 13 also generates various voltages used in a read operation, and supplies the voltages to the row selection circuit 14 and the read circuit 17.

The row selection circuit 14 includes a row decoder (not shown) and a word line driver (which will be described later). The row selection circuit 14 receives an address signal ADD from the input/output circuit 12, and sets a single word line WL corresponding to a row indicated by the received address signal ADD to a selected state. In other words, the row decoder selects a single word line WL based on an address signal ADD. The word line driver supplies a selection voltage to the word line WL selected by the row decoder, using a voltage supplied from the voltage generator 13, and supplies a non-selection voltage to the other word lines WL.

The column selection circuit 15 includes a column decoder (not shown) and a bit line driver (which will be described later). The column selection circuit 15 receives an address signal ADD from the input/output circuit 12, and sets a plurality of bit lines BL corresponding to a column indicated by the received address signal ADD to a selected state. In other words, the column decoder selects a plurality of bit lines BL based on an address signal ADD. The bit line driver supplies a selection voltage to the bit line BL selected by the column decoder, using a voltage supplied from the voltage generator 13 and transferred through the write circuit 16 or the read circuit 17, and supplies a non-selection voltage to the other bit lines BL.

The control circuit 18 receives a control signal CNT and a command CMD from the input output circuit 12. The control signal 18 controls the write circuit 16, the read circuit 17, and the voltage generator 13, based on control instructed by a control signal CNT and a command CMD. Specifically, the control circuit 18 controls a supply of voltages used for writing data to the write circuit 16 during an operation of writing data to the memory cell array 11. The control circuit 18 controls a supply of voltages used for reading data to the read circuit 17 during an operation of reading data from the memory cell array 11.

The write circuit 16 receives write data DAT from the input/output circuit 12, and supplies voltages used for data writing to the memory cells MC via the column selection circuit 15 based on the control of the control circuit 18 and the write data DAT.

The read circuit 17 includes a sense amplifier, and supplies voltages used for data reading to the memory cells MC via the column selection circuit 15 based on the control of the control circuit 18, and reads data stored in the memory cells MC. The read data is output to the input/output circuit 12 as read data DAT.

1.1.2 Circuit Configuration of Memory Cell Array

Next, a circuit configuration of the memory cell array 11 in the first embodiment is described with reference to FIG. 2A. FIG. 2A is a diagram showing a circuit configuration example of a part of the memory cell array 11. Herein, for brevity of description, FIG. 2A shows a circuit diagram in which the memory cells MC are stacked in two layers on a substrate; however, the present embodiment actually has a structure in which the memory cells MC are stacked in four layers.

As shown in FIG. 2A, the memory cell array 11 includes (n+1) (n is an integer of 0 or more) word lines WL (WL<0>, WL<1>, . . . , WL<n>), (m+1) (m is an integer of 0 or more) bit lines BLa (BLa<0>, BLa<1>, . . . , BLa<m>), and (m+1) bit lines BLb (BLb<0>, BLb<1>, . . . , BLb<m>).

The memory cells MC include: MCa<0,0>, MCa<0,1>, . . . , MCa<0,m>, MCa<1,0>, MCa<1,1>, . . . , MCa<1,m>, . . . , MCa<n,0>, MCa<n,1>, . . . , MCa<n,m>. The memory cells MC further include MCb<0,0>, MCb<0,1>, . . . , MCb<0,m>, MCb<1,0>, MCb<1,1>, . . . , MCb<1,m>, . . . , MCb<n,0>, MCb<n,1>, . . . , MCb<n,m>. Hereinafter, "memory cell MCa" refers to each of MCa<0,0> through MCa<n,m>, "memory cell MCb" refers to each of MCb<0,0> through MCb<n,m>, and "memory cell MC" refers to each of MCa<0,0> through MCa<n,m> and each of MCb<0,0> through MCb<n,m>.

The memory cells MCa are coupled between respective word lines WL<0> through WL<n> and respective bit lines BLa<0> through BLa<m>. In other words, the memory cells MCa<0,0> through MCa<n,m> are respectively coupled between the word line WL<0> and each of the bit lines BLa<0> through BLa<m>, between the word line WL<1> and each of the bit lines BLa<0> through BLa<m>, between the word line WL<2> and each of the bit lines BLa<0> through BLa<m>, . . . , and between the word line WL<n> and each of the bit lines BLa<0> through BLa<m>.

The memory cells MCb are coupled between respective word lines WL<0> through WL<n> and respective bit lines BLb<0> through BLb<m>. In other words, the memory cells MCb<0,0> through MCb<n,m> are respectively coupled between the word line WL<0> and each of the bit lines BLb<0> through BLb<m>, between the word line WL<1> and each of the bit lines BLb<0> through BLb<m>, between the word line WL<2> and each of the bit lines BLb<0> through BLb<m>, . . . , between the word line WL<n> and each of the bit lines BLb<0> through BLb<m>.

Each memory cell MC has a first node and a second node. The first node of the memory cell MC is coupled to a single word line WL, and the second node of the memory cell MC is coupled to a single bit line BL. Each memory cell MC has a single resistance change element (or variable resistance element) VR and a single selector element SE. In each memory cell MC, the resistance change element VR and the selector element SE are coupled in series.

In the present embodiment, the resistance change element VR is coupled to an interconnect of the upper side (namely, one side in a Z direction) among a single word line WL and a single bit line BL coupled to a memory cell MC, and the selector element SE is coupled to an interconnect of the lower side (namely, the other side in the Z direction). Specifically, the selector element SE of the memory cell MCa is coupled to a bit line BLa, and the resistance change element VR of the memory cell MCa is coupled to the word line WL. Furthermore, the selector element SE of the memory cell MCb is coupled to the word line WL, and the resistance change element VR of the memory cell MCb is coupled to the bit line BLb. In this case, in the memory cell array 11, a physical arrangement order (stacking order) of a resistance change element VR and a selector element SE in a memory cell MCa in a single layer (a layer at a certain position in the Z direction, or an even-numbered layer), and a memory cell MCb of another layer (a layer at another position in the Z direction, or an odd-numbered layer) become the same. Accordingly, commonality in the manufacturing method for forming layers of memory cells MCa and layers of memory cells MCb can be achieved. The manufacture of the semiconductor memory device 1 can be thus facilitated. It becomes easier to conform physical properties of the memory cells MCa and MCb of different layers.

The arrangement order of the resistance change element VR and the selector element SE may be inverted. For example, the selector element SE may be coupled to an interconnect of the upper side (namely, one side in the Z direction) among a single word line WL and a single bit line BL coupled to the memory cell MC, and the resistance change element VR may be coupled to an interconnect of the lower side (namely, the other side in the Z direction) as a single bit line BL coupled to the memory cell MC.

The arrangement order of the resistance change element VR and the selector element SE may be changed layer by layer. Another circuit configuration example of a part of the memory cell array 11 is shown in FIG. 2B. For example, as shown in FIG. 2B, the resistance change element VR may be coupled to a word line WL, and the selector element SE may be coupled to a bit line BL, regardless of the top and bottom relationship between a single word line WL and a single bit line BL coupled to a memory cell MC. Specifically, the selector element SE of the memory cell MCa may be coupled to a bit line BLa, and the resistance change element VR of the memory cell MCa may be coupled to a word line WL, and further the resistance change element VR of the memory cell MCb may be coupled to the word line WL, and the selector element SE of the memory cell MCb may be coupled to a bit line BLb. In this case, in a current path from a word line WL to a bit line BL via a memory cell MC, the electric arrangement order of the resistance change element VR and the selector element SE is the same regardless of the layer of the memory cell MC in the memory cell array 11 (in other words, regardless of a position in the Z direction of the memory cell MC, or regardless of whether the memory cell MC is the memory cell MCa of an even-numbered layer or the memory cell MCb of an odd-numbered layer). Thus, in the semiconductor device 1, it becomes easier to conform the voltage-current characteristics and write operation characteristics among the memory cells MC.

Also in this circuit configuration, the arrangement order of the resistance change element VR and the selector element SE may be inverted.

The resistance change element VR may be switched between a low-resistance state and a high-resistance state. The resistance change element VR stores 1-bit data utilizing a difference between these resistance states, namely the low-resistance state and the high-resistance state.

The selector element SE has two terminals. When a voltage less than a first threshold value is applied in a first direction between the two terminals, the selector element SE is in a high-resistance state, for example in an electrically non-conductive state (or in an off state). On the other hand, when a voltage equal to or greater than a first threshold value is applied in the first direction between the two terminals, the selector element SE is in a low-resistance state, for example in an electrically conductive state (or in an on state). Similarly, when a voltage less than a first threshold is applied between two terminals in a second direction which is opposite to the first direction, the selector element SE is in a high-resistance state, for example an electrically non-conductive state (or in an off state). On the other hand, when a voltage equal to or greater than a first threshold value is applied in the second direction between the two terminals, the selector SE is in a low-resistance state, for example, in an electrically conductive state (or in an on state). In the present embodiment, the selector element SE is a bidirectional rectifier capable of causing a current to flow in the resistance change element VR in two directions. As the selector element SE, a bidirectional diode may be used, for example. Depending on a circuit configuration, a diode serving as a uni-directional rectifier may be used as the selector element SE.

By turning on or off the selector element SE, it is possible to perform control as to whether or not to supply a current to a resistance change element VR coupled to the selector element SE, namely, whether or not to select the resistance change element VR.

1.2 Configuration of Memory Cell Array

Next, the configuration of the memory cell array 11 in the first embodiment will be described. FIG. 3A is a perspective view schematically showing an example of a structure of a part of the memory cell array 11 according to the first embodiment. In FIG. 3A, two directions that are orthogonal to (or intersect) each other and are both parallel to the surface of a semiconductor substrate are referred to as X and Y directions. Furthermore, the direction which is orthogonal to the X and Y directions (X-Y plane) and in which a plurality of conductive layers (word lines WL and bit lines BL) are stacked is referred to as a Z direction (or a stacking direction).

As shown in FIG. 3A, conductive layers 21, 22, and 23 are provided above the semiconductor substrate 20. The conductive layers 21 extend in the Y direction, and are aligned at intervals in the X direction. The conductive layers 22 extend in the X direction, and are aligned at intervals in the Y direction. The conductive layers 23 extend in the Y direction, and are aligned at intervals in the X direction.

The conductive layers 21 are arranged above the semiconductor substrate 20 (namely on one side in the Z direction). The conductive layers 22 are arranged above the conductive layers 21 (namely on one side in the Z direction). Furthermore, the conductive, layers 23 are arranged above the conductive layers 22 (namely on one side in the Z direction). The conductive layers 21 correspond to the bit lines BLa. The conductive layers 22 correspond to the word lines WL, and the conductive layers 23 correspond to the bit lines BLb.

A plurality of memory cells MC are three-dimensionally aligned in the X, Y, and Z directions. In other words, some of the plurality of memory cells MC are aligned in a matrix on the X-Y plane at a certain position in the Z direction, and others of the plurality of memory cells MC are aligned in a matrix on the X Y plane at another position in the Z direction.

The memory cells MC are arranged where the conductive layers 21 (BLa) and conductive layers 22 (WL) crossover when viewed from the Z direction. That is to say, the memory cell MC is arranged between, the conductive layer 21 (BLa) and the conductive layer 22 (WL) in the Z direction. The memory cells MC are arranged where the conductive layers 22 (WL) and the conductive layers 23 (BLb) cross over when viewed from the Z direction. That is to say, the memory cell MC is arranged between the conductive layer 22 (WL) and the conductive layer (BLb) in the Z direction.

In other words, the conductive layer 22 is provided between two memory cells MC consecutively arranged in the Z direction. Two memory cells M consecutively arranged in the Z direction share the conductive layer 22 therebetween. In other words, two memory cells MC consecutively arranged in the Z direction are coupled in common to a word line WL.

The two memory cells MC arranged consecutively to each other in the Z direction are coupled to bit lines BLa and BLb, respectively. Of the two consecutive memory cells MC, one memory cell MC is coupled to a bit line BLa below the word line WL (namely on the other side in the Z direction), and the other memory cell is coupled to a bit line BLb above the word line WL (namely on the one side in the Z direction).

Specifically, as shown in FIG. 3A, the selector element SE and the resistance change element VR of the memory cell MC are provided in this order on one Z-direction side of the conductive layer 21 (BLa), and the conductive layer 22 (WL) is provided on one Z-direction side of the resistance change element VR. Furthermore, the selector element SE and the resistance change element VR of the memory cell MC are provided in this order on one Z-direction side of the conductive layer 22 (WL), and the conductive layer 23 (BLb) is provided on one Z-direction side of the resistance change element VR.

Figure 3B:
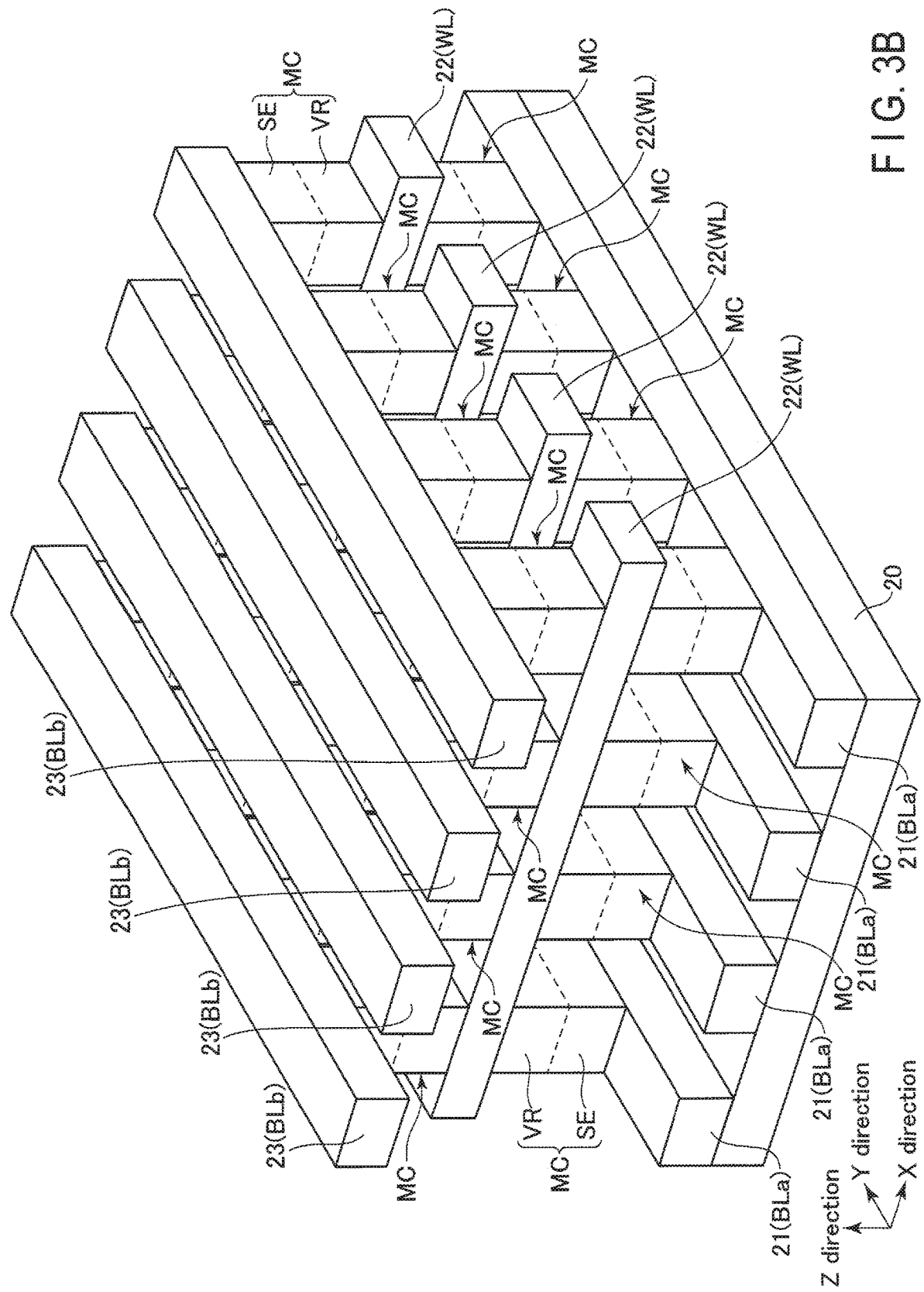
FIG. 3B is a perspective view schematically showing another example of a structure of a part of the memory cell array according to the first embodiment.

Described herein is an example wherein the position relationship between the selector element SE and the resistance change element VR with respect to the Z direction in the memory cells are the same for all the stacked memory cells; however, the selector element SE and the resistance change element VR may be inverted in their positions in each layer. For example, in the memory cell MC provided on the other Z-direction side of the conductive layer 22 (WL), the selector element SE may be provided on the other Z-direction side, and the resistance change element VR may be provided on one Z-direction side; in the memory cell MC provided on one Z-direction side of the conductive layer 22 (WL), the selector element SE may be provided on one Z-direction side, and the resistance change element VR may be provided on the other Z-direction side. Another configuration example of a part of the memory cell array 11 is shown in FIG. 3B. For example, as shown in FIG. 3B, the selector elements SE and the resistance change elements VR of the memory cells MC are provided in order on one Z direction side of the conductive layers 21 (BLa), and the conductive layers 22 (WL) are provided on one side of the resistance change elements VR in the Z direction. Furthermore, the resistance change element VR and the selector element SE of the memory cell MC are provided in order on one Z-direction side of the conductive layer 22 (WL), and the conductive layer 23 (BLb) is provided on one Z-direction side of the selector element SE.

The X-direction or Y-direction dimension of the memory cell MC is approximately the same as, for example, the width of the bit line BLa/BLb or word line WL coupled on the upper and lower sides of the Z direction. In other words, in the configurations illustrated in FIGS. 3A and 3B, the X-direction dimension of the memory cell MC arranged on the upper side of the Z direction is approximately the same as the width of the bit line BLb coupled on the upper side (the X-direction dimension), and the Y-direction dimension of the memory cell MC is approximately the same as the width of the word line WL coupled on the lower side (the Y-direction dimension). Furthermore, the Y-direction dimension of the memory cell MC arranged on the lower side of the Z direction of the structure shown in FIGS. 3A and 3B is approximately the same as the width of the word line WL coupled on the upper side (the Y-direction dimension), and the X-direction dimension of the memory cell MC is approximately the same as the width of the bit line BLa coupled on the lower side (the X-direction dimension).

Each memory cell MC has a resistance change element VR and a selector element SE. The stack of the selector element SE and the resistance change element VR is arranged between the conductive layers 21 and the conductive layers 22. Furthermore, the stack of the resistance change element VR and the selector element SE is arranged between the conductive layers 22 and the conductive layers 23. The resistance change element VR includes an MTJ (magnetic tunnel junction) for example. The selector elements SE include, for example, transition-metal compound or a chalcogenide compound.

Hereinafter, a predetermined area that includes the plurality of memory cells MC three-dimensionally aligned in the X, Y, and Z directions will be called "mat". The memory cell array 11 includes a plurality of mats.

On the semiconductor substrate 20, circuits other than the memory cell array 11, such as the row selection circuit 14 and the column selection circuit 15 (hereinafter, "peripheral circuit" or "CMOS circuit"), are provided. In this case, the memory cell array 11 is provided above the peripheral circuit (namely in the Z direction) for example.

Figure 7:
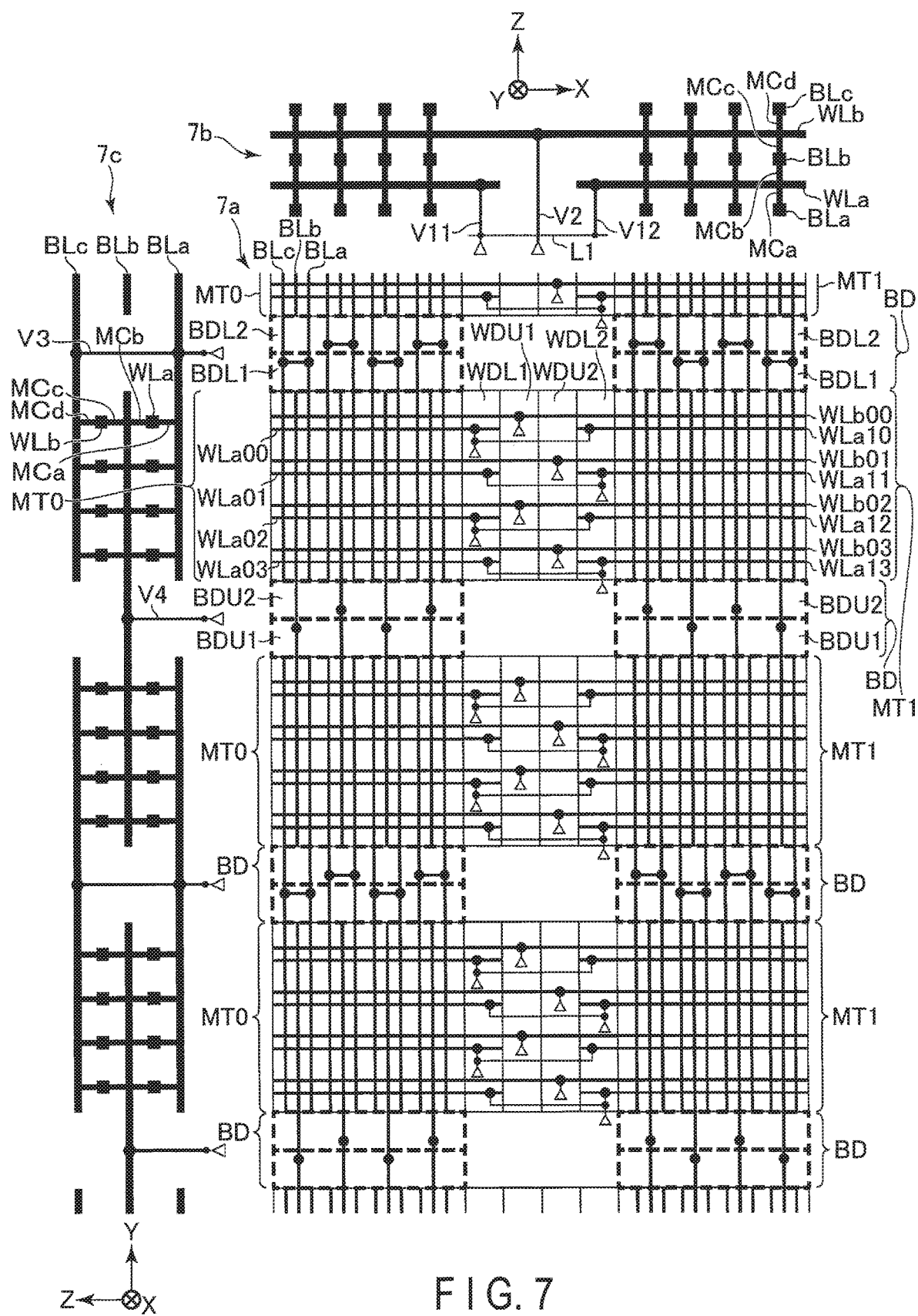
FIG. 7 is a drawing schematically showing an arrangement and couplings of word line drivers and bit line drivers in the first embodiment.

FIGS. 2A, 2B, 3A, and 3B show examples wherein the memory cell 11 includes three layers of conductive layers (bit lines BLa, word lines WL, and bit lines BLb), and two layers of the memory cells MC arranged therebetween, respectively; however, the present embodiment is not limited to these examples. For example, as shown in FIG. 7, the memory cell array may include five layers of conductive layers (bit lines BLa, word lines WLa, and bit lines BLb, word lines WLb, and bit lines BLc), and four layers of the memory cells MC arranged therebetween. Alternatively, the memory cell array may be configured with seven layers of conductive layers (for example, four layers of bit lines BL and three layers of word lines WL), and six layers of the memory cells MC arranged therebetween respectively, or nine layers of conductive layers (for example, five layers of bit lines BL and four layers of word lines WL), and eight layers of the memory cells MC arranged therebetween respectively.

Either the bit lines BL or the word lines WL are not necessarily controlled layer by layer if there are three or more layers of them, and the odd-numbered layers and the even-numbered layers maybe respectively controlled in a batch. For example, if the memory cell array is configured with three layers of bit lines BLa, BLb, and BLc, and two layers of word lines WLa and WLb, the column selection circuit 15 may apply a common voltage to the bit lines BLa and BLc.

The locations of the word lines WL and the locations of the bit line BL may be interchanged. In this case, the locations of the row selection circuit and the column selection circuit are interchanged, the locations of the row decoder and the column decoder are interchanged, and the locations of the word line drivers and the bit line drivers are interchanged 1.3 Arrangement of Word Line Drivers Next, an arrangement of the word line drivers in the semiconductor memory device according to the first embodiment will be explained. For example, the memory cell array 11 includes a plurality of banks, each bank includes a plurality of row blocks, and each row block includes a plurality of mats. The plurality of mats are aligned in a row direction, and word line drivers are provided for the mats.

Figure 4:
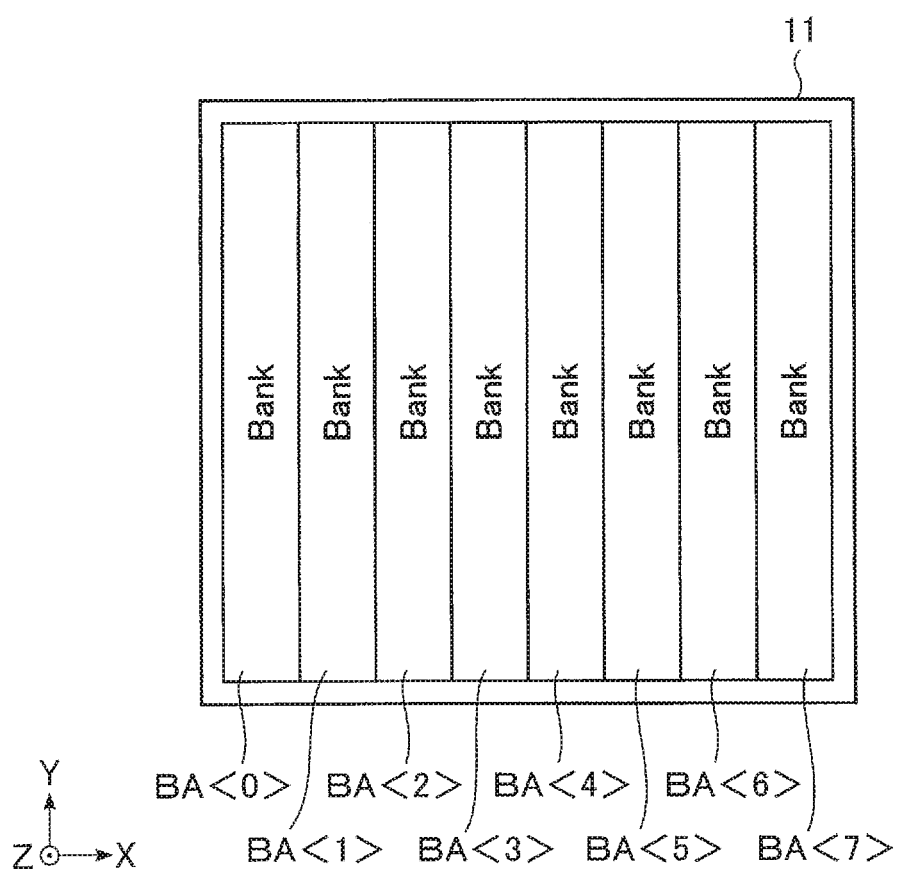
FIG. 4 is a diagram showing a bank configuration of the memory cell array according to the first embodiment.

FIG. 4 is a diagram showing a bank configuration of the memory cell array 11 according to the first embodiment. The memory cell array 11 includes a plurality of banks, for example, bank BA<0>, BA<1>, BA<2>, . . . , BA<7>. Each of the banks BA<0> through BA<7> extends in the Y direction (the longitudinal direction of each of the banks BA<0> through BA<7> is along the Y direction), and the banks BA<0> through BA<7> are aligned in the X direction. Herein, an example is given where the memory cell array 11 includes eight banks BA<0> through BA<7>; however, the number of banks can be discretionarily determined. Hereinafter, assume "bank BA" refers to each of the bank BA<0> through the bank BA<7>.

Next, the configuration of each of the bank BA<0> through the bank BA<7> is explained. Since the configuration of each of the banks BA<0> through BA<7> is the same, a bank BA represents the banks in the following description of the configuration.

Figure 5:
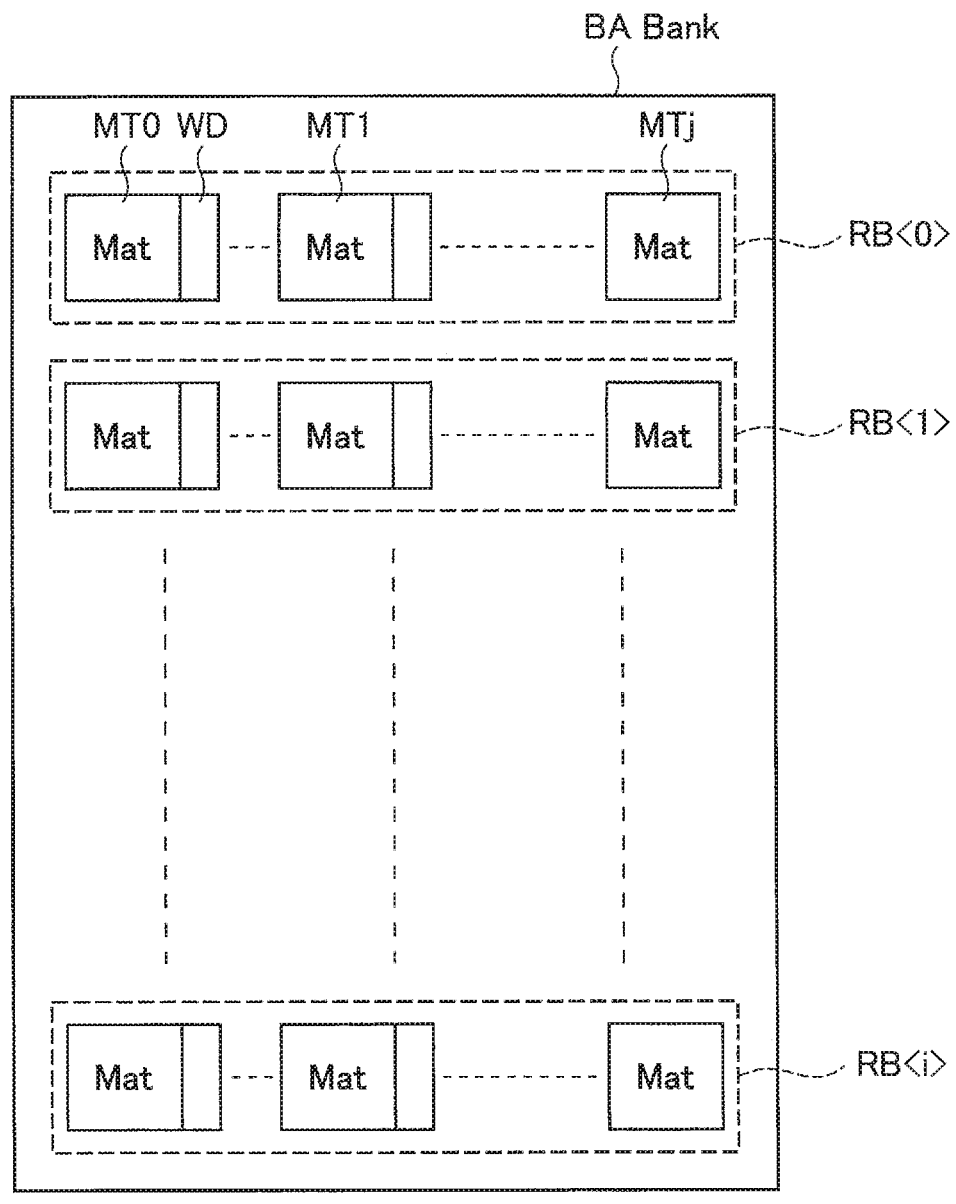
FIG. 5 is a diagram showing a configuration of a row block in a bank of the memory cell array according to the first embodiment.

FIG. 5 is a diagram showing a configuration of the row blocks in a bank BA of the memory cell array 11. The bank BA includes a plurality of row blocks, for example row blocks RB<0>, RB<1>, RB<2>, . . . , RB<i>. Each of the row blocks RB<0> through RB<i> extends in the X direction (the longitudinal direction of each of the row blocks RB<0> through RB<i> is along the X direction) and the row blocks RB<0> through RB<i> are aligned in the Y direction. The symbol i is an integer not less than 0. Hereinafter, assume "row block RB" refers to each of the row blocks RB<0> through RB<i>.

Since the configuration of each of the row blocks RB<0> through RB<i> is the same, a row block RB represents the row blocks in the following description of the configuration.

The row block RB includes a plurality of mats MT0, MT1, . . . , MTj (j is an integer of 0 or more), and a plurality of word line drivers WD, for example. The mats MT0 through MTj are aligned in the X direction. Hereinafter, assume "mat MT" refers to each of the mats MT0 through MTj. The word line drivers WD are arranged between two mats MT arranged adjacent to each other with respect to the X direction, or in the proximity of the mats MT.

Figure 6:
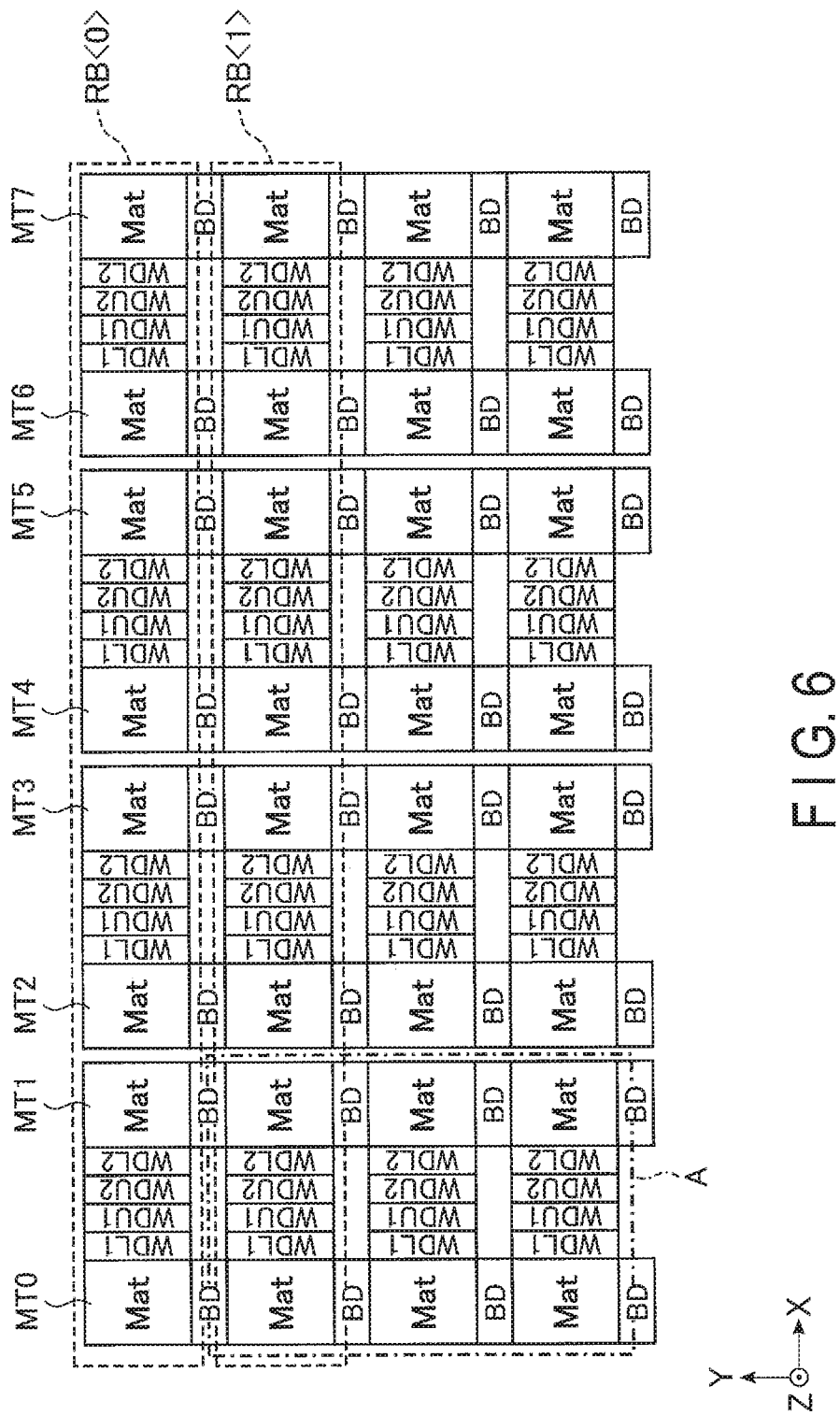
FIG. 6 is a drawing showing an arrangement of mats and word line drivers in the first embodiment.

Hereinafter, the details of the arrangement of the mats MT and the word line drivers WD in the row block RB will be explained. FIG. 6 is a drawing showing an arrangement of the mats MT and the word line drivers WD in the first embodiment. Herein, an example wherein the memory cells MC are stacked in four layers in the Z direction is illustrated. In this case, five layers of interconnect layers are used in the Z direction.

The row block RB includes the mats MT0 thorough MTj as described above, and the number of the mats is discretionarily determined. Herein, as an example, the row block RB includes eight mats MT0 through MT7, and two mats MT constitute a single unit. Specifically, the mats MT0 and MT1 constitute a unit; similarly, the mats MT2 and MT3, the mats MT4 and MT5, and the mats MT6 and MT7 respectively constitute units.

Each mat MT includes four layers of memory cells MC stacked in the Z direction. Of the four layers of memory cells MC, two layers of memory cells MC on the semiconductor substrate side are coupled to the word lines WL of the lower layers. The other two layers of memory cells MC are coupled to the word lines WL of the upper layers.

The row block RB includes a plurality of the word line drivers WD, as mentioned above. Each word line driver WD is provided in correspondence to two mats MT constituting a unit or a single mat MT. The word line driver WD includes four word line drivers WDL1, WDL2, WDU1, and WDU2.

As shown in FIG. 6, the mats MT0 through MT7 are aligned in order in the X direction. Between the mat MT0 and the mat MT1, a lower layer word line driver (even-numbered lower layer word line driver) WDL1, an upper layer word line driver (even-numbered upper layer word line driver) WDU1, an upper layer word line driver (odd-numbered lower layer word line driver) WDU2, and a lower layer word line driver (odd-numbered lower layer word line driver) WDL2 corresponding to the mats MT0 and MT1 are arranged. The upper layer word line drivers WDU1 and WDU2 are arranged between the lower layer word line drivers WDL1 and WLD2. In other words, between the mat MT0 and the mat MT1, the word line drivers WDL1, WDU1, WDU2, and WDL2 are aligned in this order, from the mat MT0 toward the mat MT1.

The lower layer word line drivers WDL1 and WDL2 drive the lower layer word lines WL coupled to the memory cells MC of the mats MT0 and MT1. The upper layer word line drivers WDU1 and WDU2 drive the upper layer word lines WL coupled to the memory cells MC of the mats MT0 and MT1.

Between the mat MT2 and the mat MT3, a lower layer word line driver (even-numbered lower layer word line driver) WDL1, an upper layer word line driver (even-numbered upper layer word line driver) WDU1, an upper layer word line driver (odd-numbered lower layer word line driver) WDU2, and a lower layer word line driver (odd-numbered lower layer word line driver) WDL2 corresponding to the mats MT2 and MT3 are arranged. In other words, between the mat MT2 and the mat MT3, the word line drivers WDL1, WDU1, WDU2, and WDL2 are aligned in this order, from the mat MT2 toward the mat MT3. The lower layer word line drivers WDL1 and WDL2 drive the lower layer word lines WL coupled to the memory cells MC of the mats MT2 and MT3, and the upper layer word line drivers WDU1 and WDU2 drive the upper layer word lines WL coupled to the memory cells MC of the mats MT2 and MT3.

Similarly, between the mat MT4 and the mat MT5, a lower layer word line driver (even-numbered lower layer word line driver) WDL1, an upper layer word line driver (even-numbered upper layer word line driver) WDU1, an upper layer word line driver (odd-numbered lower layer word line driver) WDU2, and a lower layer word line driver (odd-numbered lower layer word line driver) WDL2 corresponding to the mats MT4 and MT5 are arranged. In other words, between the mat MT4 and the mat MT5, the word line drivers WDL1, WDU1, WDU2, and WDL2 are aligned in this order, from the mat MT4 toward the mat MT5. The lower layer word line drivers WDL1 and WDL2 drive the lower layer word lines WL coupled to the memory cells MC of the mats MT4 and MT5, and the upper layer word line drivers WDU1 and WDU2 drive the upper layer word lines WL coupled to the memory cells MC of the mats MT4 and MT5.

Further similarly, between the mat MT6 and the mat MT7, a lower layer word line driver (even-numbered lower layer word line driver) WDL1, an upper layer word line driver (even-numbered upper layer word line driver) WDU1, an upper layer word line driver (odd-numbered lower layer word line driver) WDU2, and a lower layer word line driver (odd-numbered lower layer word line driver) WDL2 corresponding to the mats MT6 and MT7 are arranged. In other words, between the mat MT6 and the mat MT7, the word line drivers WDL1, WDU1, WDU2, and WDL2 are aligned in this order, from the mat MT6 toward the mat MT7. The lower layer word line drivers WDL1 and WDL2 drive the lower layer word lines WL coupled to the memory cells MC of the mats MT6 and MT7, and the upper layer word line drivers WDU1 and WDU2 drive the upper layer word lines WL coupled to the memory cells MC of the mats MT6 and MT7.

A bit line driver BD is arranged between the row blocks RB adjacently arranged with respect to the Y direction. Specifically, the bit line driver BD is arranged between the mats MT arranged in a corresponding X-direction position, in two row blocks RB adjacently arranged with respect to the Y direction. For example, the bit line driver BD is arranged between: the mat MT0 of the row block RB<0> and the mat MT0 of the row block RB<1>; the mat MT1 of the row block RB<0> and the mat MT1 of the row block RB<1>; the mat MT2 of the row block RB<0> and the mat MT2 of the row block RB<1>; the mat MT7 of the row block RB<0> and the mat MT7 of the row block RB<1>. The bit line driver BD drives the bit line BL coupled to the memory cells in the mat MT.

Next, with reference to FIG. 7, the arrangement and couplings of the memory cells MC, the word lines WL, the bit lines BL, the word line drivers WD, and the bit line drivers BD are described. FIG. 7 is a drawing schematically showing an arrangement and couplings of the word line drivers WD and the bit line drivers BD in the first embodiment.

FIG. 7 is a drawing showing the area A shown in FIG. 6 in detail. 7a in FIG. 7 is a schematic drawing of the arrangement of the word lines WL, the bit lines BL, the word line drivers WD, and the bit line drivers BD. 7b in FIG. 7 is a diagram of the word lines WL, the bit lines BL, and the word line drivers WD viewed from the Y direction. 7c in FIG. 7 is a diagram of the bit lines BL, the word lines WL, and the bit line drivers BD viewed from the X direction. In the explanation hereinafter, the left and the right respectively correspond to those in each drawing.

In 7c of FIG. 7, for the sake of explanation, the width (the Y-direction dimension) of the word line WLa appears differently from the Y-direction dimensions of the memory cells MCa and MCb arranged in the upper and lower sides of the Z-direction; however, those dimensions may be approximately the same as those shown in FIGS. 3A and 3B. The width (the Y-direction dimension) of the word line WLb and the Y-direction dimensions of the memory cells MCc and MCd may also be approximately the same. Similarly, in 7b of FIG. 7, for the sake of explanation, the width (the X-direction dimension) of the bit line BLb appears differently from the X-direction dimensions of the memory cells MCb and MCc arranged in the upper and lower sides of the Z-direction; however, those dimensions may be approximately the same as shown in FIGS. 3A and 3B. The width (the X-direction dimension) of the bit line BLa and the X-direction dimension of the memory cells MCa may also be approximately the same. The width (the X-direction dimension) of the bit line BLc and the X-direction dimension of the memory cell MCd may also be approximately the same.

As described above, between the mat MT0 and the mat MT1 arranged in the X direction, a lower layer word line driver (even-numbered lower layer word line driver) WDL1, an upper layer word line driver (even-numbered upper layer word line driver) WDU1, an upper layer word line driver (odd-numbered lower layer word line driver) WDU2, and a lower layer word line driver (odd-numbered lower layer word line driver) WDL2 are arranged.

In the mat MT0, a plurality of lower layer word lines WLa00, WLa01, WLa02, and WLa03 are arranged. In the mat MT1, a plurality of lower layer word lines WLa10, WLa11, WLa12, and WLa13 are arranged. Hereinafter, assume "lower layer word line WLa0" refers to each of the lower layer word lines WLa00 through WLa03, "lower layer word line WLa1" refers to each of the lower layer word lines WLa10 through WLa13, "lower layer word line WLa" refers to each of the lower layer word line WLa00 through WLa03 and WLa10 through WLa13. FIG. 7 shows an example where there are four word lines in each layer of each mat; however, the present embodiment is not limited to this example. The number of the word lines may be, for example, 16, 32, or 64, and can be discretionarily determined. The same applies to the bit lines.

The lower layer word line WLa1 is formed on the same interconnect layer as the layer where the lower layer word line WLa0 exists. In other words, the lower layer word line WLa0 and the lower layer word line WLa1 are arranged at layers at the same height (or distance) from the surface of the semiconductor substrate.

Each of the lower layer word lines WLa00 through WLa03 extends in the X direction. The lower layer word lines WLa00 through WLa03 are aligned in the Y direction. Similarly, each of the lower layer word lines WLa10 through WLa13 extends in the X direction. The lower layer word lines WLa10 through WLa13 are aligned in the Y direction. The lower layer word line WLa00 and the lower layer word line WLa10 are arranged on approximately a straight line; the lower layer word line WLa01 and the lower layer word line WLa11 are arranged on approximately a straight line; the lower layer word line WLa02 and the lower layer word line WLa12 are arranged on approximately a straight line; and the lower layer word line WLa03 and the lower layer word line WLa13 are arranged on approximately a straight line. The meaning of "arranged on approximately a straight line" herein means not only that the lower layer word line WLa0 and the lower layer word line WLa1 constitute strictly the same lower layer line but also that the lower layer word lines are under the influence of fluctuations in a manufacturing process.

The lower layer word lines WLa00 through WLa03 aligned in the Y direction are alternately set at an even-numbered layer and an odd-numbered layer. Similarly, the lower layer word lines WLa10 through WLa13 aligned in the Y direction are alternately set at an even-numbered layer and an odd-numbered layer. The lower layer word lines WLa0 and WLa1 of the same even-numbered layer or the same odd-numbered layer are electrically connected via, for example, the lower layer interconnect L1 and vias (or contact plugs) V11 and V12. Thus, the lower layer word line WLa0 in the mat MT0 and the lower layer word line WLa1 in the mat MT1 are divided in the X direction in terms of structure, and they are electrically coupled by the lower layer interconnect L1 and the vias V11 and V12.

The lower layer word line driver (even-numbered side lower layer word line driver) WDL1 is electrically coupled to the even-numbered lower layer word line WLa0 and the even-numbered lower layer word line WLa1 via the lower layer interconnect L1 and the vias V11 and V12. Thus, the lower layer word line driver WDL1 drives the even-numbered lower layer word lines WLa0 and WLa1, in other words, applies a write voltage and a read voltage the even-numbered lower layer word lines WLa0 and WLa1 at the time of a write operation and a read operation, respectively.

The lower layer word line driver (odd-numbered side lower layer word line driver) WDL2 is electrically coupled to the odd-numbered lower layer word line WLa0 and the odd-numbered lower layer word line WLa1 via the lower layer interconnect L1 and the vias V11 and V12. Thus, the lower layer word line driver WDL2 drives the odd-numbered lower layer word lines WLa0 and WLa1, in other words, applies a write voltage and a read voltage to the odd-numbered lower layer word lines WLa0 and WLa1 at the time of a write operation and a read operation, respectively.

In the mats MT0 and MT1, a plurality of upper layer word lines WLb00, WLb01, WLb02, and WLb03 are arranged. Hereinafter, assume "upper layer word line WLb" refers to each of the upper layer word lines WLb00 through WLb03. The upper layer word line WLb is arranged above the lower layer word lines WLa0 and WLa1 (or in the positive side of the Z direction (i.e., the direction indicated by the arrow)). In other words, the upper layer word line WLb is arranged at a position higher than the position of the lower layer word lines WLa0 and WLa1 from the surface of the semiconductor substrate. In the mats MT0 and MT1, the lower layer word lines WLa0 and WLa1 are divided, whereas the upper layer word line WLb is not divided and is integrally continuous.

Each of the upper layer word lines WLb00 through WLb03 extends in the X direction. The upper layer word lines WLb00 through WLb03 are aligned in the Y direction. The upper layer word lines WLb00 through WLb03 aligned in the Y direction are alternately set at an even-numbered layer and an odd-numbered layer.

The upper layer word line driver (even-numbered upper layer word line driver) WDU1 is electrically coupled to the even-numbered upper layer word lines WLb00 and WLb02 via a via V2. Thus, the upper layer word line driver WDU1 drives the even-numbered upper layer word lines WLb00 and WLb02, in other words, applies a write voltage and a read voltage to the upper layer word lines WLb00 and WLb02 at the time of a write operation and a read operation, respectively.

The upper layer word line driver (odd-numbered side upper layer word line driver) WDU2 is electrically coupled to the odd-numbered upper layer word lines WLb01 and WLb03 via the via V2. Thus, the upper layer word line driver WDU2 drives the odd-numbered upper layer word lines WLb01 and WLb03, in other words, applies a write voltage and a read voltage to the upper layer word lines WLb01 and WLb03 at the time of a write operation and a read operation, respectively.

Between the mats MT0 and MT0 adjacently arranged in the Y direction and between the mats MT1 and MT1 adjacently arranged in the Y direction, the lower layer bit line drivers BDL1 and BDL2, or the upper layer bit line drivers BDU1 or BDU2, are arranged. The lower layer bit line drivers BDL1 and BDL2, and the upper layer bit line drivers BDU1 and BDU2 are aligned alternately between the mats MT0 and MT0 in the Y direction. Similarly, the lower layer bit line drivers BDL1 and BDL2, and the upper layer bit line drivers BDU1 or BDU2 are aligned alternately between the mats MT1 and MT1 in the Y direction.

A plurality of bit lines BLa are arranged above the semiconductor substrate (or in the positive side of the Z direction). Each of the bit lines BLa extends in the Y direction. The plurality of bit lines BLa are aligned in the X direction. A plurality of bit lines BLb are arranged above the bit lines BLa. Each of the bit lines BLb extends in the Y direction. The plurality of bit lines BLb are aligned in the X direction. Further, a plurality of bit lines BLc are arranged above the bit lines BLb. Each of the bit lines BLc extends in the Y direction. The plurality of bit lines BLc are aligned in the X direction.

The bit line BLa is shared between two adjacent mats MT, and arranged therebetween. The bit line BLb is shared between two adjacent mats MT, and arranged therebetween. The bit line BLc is shared between the same two adjacent mats MT as the bit lines BLa, and arranged therebetween. In other words, the bit lines BLa and BLc are arranged in the same two mats MT. A half of the bit line BLb is arranged in one of the two mats MT in which the bit lines BLa and BLc are arranged, and the other half is arranged in the other of the two mats MT in which the bit lines BLa and BLc are arranged.

Between the two mats MT in which the bit lines BLa and BLc are arranged, the lower layer bit line driver BDL1 and BDL2 are arranged. The upper layer bit line drivers BDU1 and BDU2 are arranged between two mats MT in which the bit line BLb is arranged.

The plurality of bit lines BLa aligned in the X direction are alternately set at an even-numbered layer and an odd-numbered layer. Similarly, the bit lines BLc aligned in the X direction are alternately set at an even-numbered layer and an odd-numbered layer. The same even-numbered or odd-numbered bit lines BLa and BLc are electrically coupled to each other via a via (or contact plug) V3, for example.

The lower layer bit line driver BDL1 is electrically coupled to the even-numbered bit line BLa and the even-numbered bit line BLc via the via V3. The lower layer bit line driver BDL1 drives the even-numbered bit lines BLa and BLc, in other words, applies a write voltage and a read voltage to these bit lines BLa and BLc at the time of a write operation and a read operation, respectively.

The lower layer bit line driver BDL2 is electrically coupled to the odd-numbered bit line BLa and the odd-numbered bit line BLc via the via V3. The lower layer bit line driver BDL2 drives the odd-numbered bit lines BLa and BLc, in other words, applies a write voltage and a read voltage to the bit lines BLa and BLc at the time of a write operation and a read operation, respectively.

The bit line BLb is electrically connected to the upper layer bit line driver BDU1 or BDU2 via a via (or contact plug) V4, for example.

The upper layer bit line driver BDU1 is electrically coupled to the even-numbered bit line BLb via the via V4. The upper layer bit line driver BDU1 drives the even-numbered bit line BLb, in other words, applies a write voltage and a read voltage to the bit line BLb at the time of a write operation and a read operation, respectively.

The bit line driver BDU2 is electrically coupled to the odd-numbered bit line BLb via the via V4. The bit line driver BDU2 drives the odd-numbered bit line BLb, in other words, applies a write voltage and a read voltage to the bit line BLb at the time of a write operation and a read operation, respectively.

The memory cells MCa through MCd are arranged respectively at the intersections of the bit lines BLa through BLc and the word lines WLa and WLb. Specifically, at the intersection of the bit line BLa and the word line WLa, the memory cell MCa is arranged between the bit line BLa and the word line WLa. At the intersection of the word line WLa and the bit line BLb, the memory cell MCb is arranged between the word line WLa and the bit line BLb. At the intersection of the bit line BLb and the word line WLb, the memory cell MCc is arranged between the bit line BLb and the word line WLb. Further, at the intersection of the word line WLb and the bit line BLc, the memory cell MCd is arranged between the word line WLb and the bit line BLc.

In other words, the word line WLa is provided on the bit line BLa with the memory cell MCa interposed therebetween. On the Word line WLa, the bit line BLb is provided with the memory cell MCb interposed therebetween. On the bit line BLb, the word line WLb is provided with the memory cell MCc interposed therebetween. Further, the bit line BLc is provided on the word line WLb with the memory cell MCd interposed therebetween.

The word lines WLa0 and WLa1 are divided on an area where the upper layer word line drivers WDU1 and WDU2 are arranged. The word lines WLa0 and WLa1 are divided because the via V2 that couples the upper layer word line drivers WDU1 and WDU2 to the word line WLb needs to be arranged between the mats MT0 an MT1. For this reason, the word lines WLa0 and WLa1 are electrically coupled to the lower layer interconnect L1 arranged below these word lines WLa0 and WLa1 via the vias V11 and V12.

Figure 8:
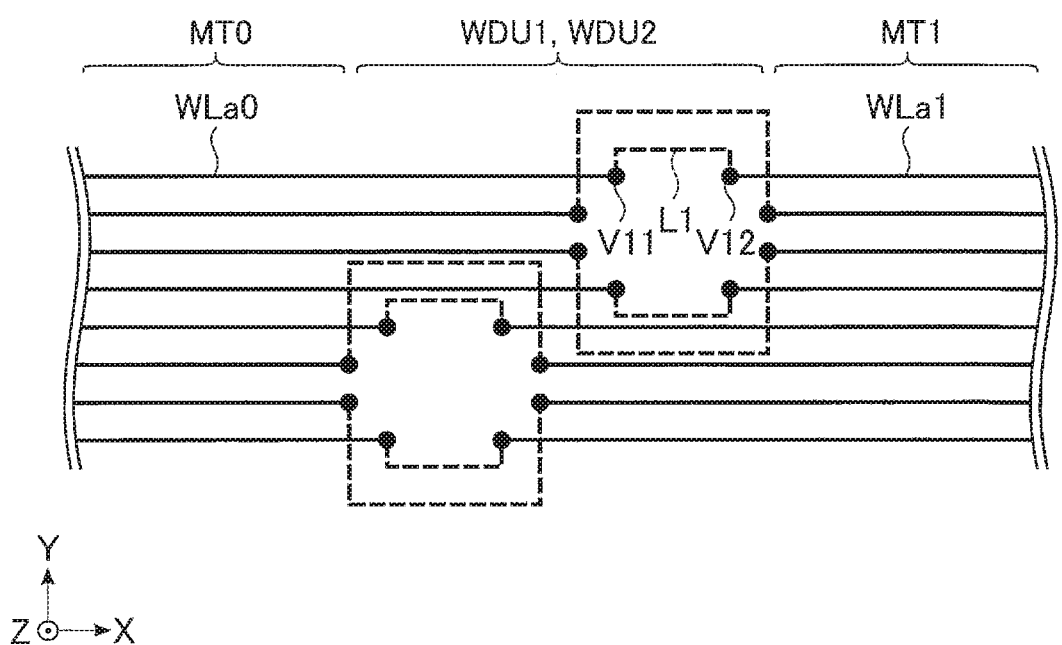
FIG. 8 is a plan view schematically showing couplings between divided word lines shown in FIG. 7.

FIG. 8 is a plan view schematically showing couplings between the word line WLa0 and the word line WLa1. As shown in FIG. 8, the word line WLa0 is coupled to the lower layer interconnect L1 via the via V11. The lower layer interconnect L1 is coupled to the word line WLa1 via the via V12. In other words, the word lines WLa0 and WLa1 are electrically coupled to each other via the via V11, the lower layer interconnect L1, and the via V12. The via V11 electrically connects the word line WLa0 to the lower layer interconnect L1. The under layer interconnect L1 is arranged at a layer lower than the word lines WLa0 and WLa1, and electrically couples the via V11 to the via V12. The via V12 electrically connects the word line WLa1 to the lower layer interconnect L1.

If an arrangement such as the one shown in FIG. 7 is adopted, a peripheral circuit including the word line drivers WD and the bit line drivers BD is formed on the semiconductor substrate, and the memory cell array 11 including the mats MT is formed above this peripheral circuit.

1.4 Operations

At a data write operation or a data read operation, a single resistance change element VR is selected. For this reason, only the selector element (hereinafter, "selection-target selector element") SE coupled to the selected resistance change element VR is turned on.

At a data write operation, an appropriate write voltage is applied to the word line WL coupled to the resistance change element VR of a memory cell MC as a write target and the bit line BL coupled to the selection-target selector element SE. With this write voltage, a write current Iw flows in the resistance change element VR. The write current Iw shifts the resistance change element VR to a low resistance state or a high resistance state.

At a data read operation, an appropriate read voltage is applied to the word line WL coupled to the resistance change element VR of a memory cell MC as a read target and the bit line BL coupled to the selection-target selector element SE. With this read voltage, a write current Ir flows in the resistance change element VR. The read current Ir has a certain amplitude depending on a low resistance state or a high resistance state of the resistance change element VR. The resistance state of the resistance change element VR is determined by the read circuit 17 based on the amplitude of the read current Ir flowing in the resistance change element VR.

1.5 Modifications.

Figure 9:
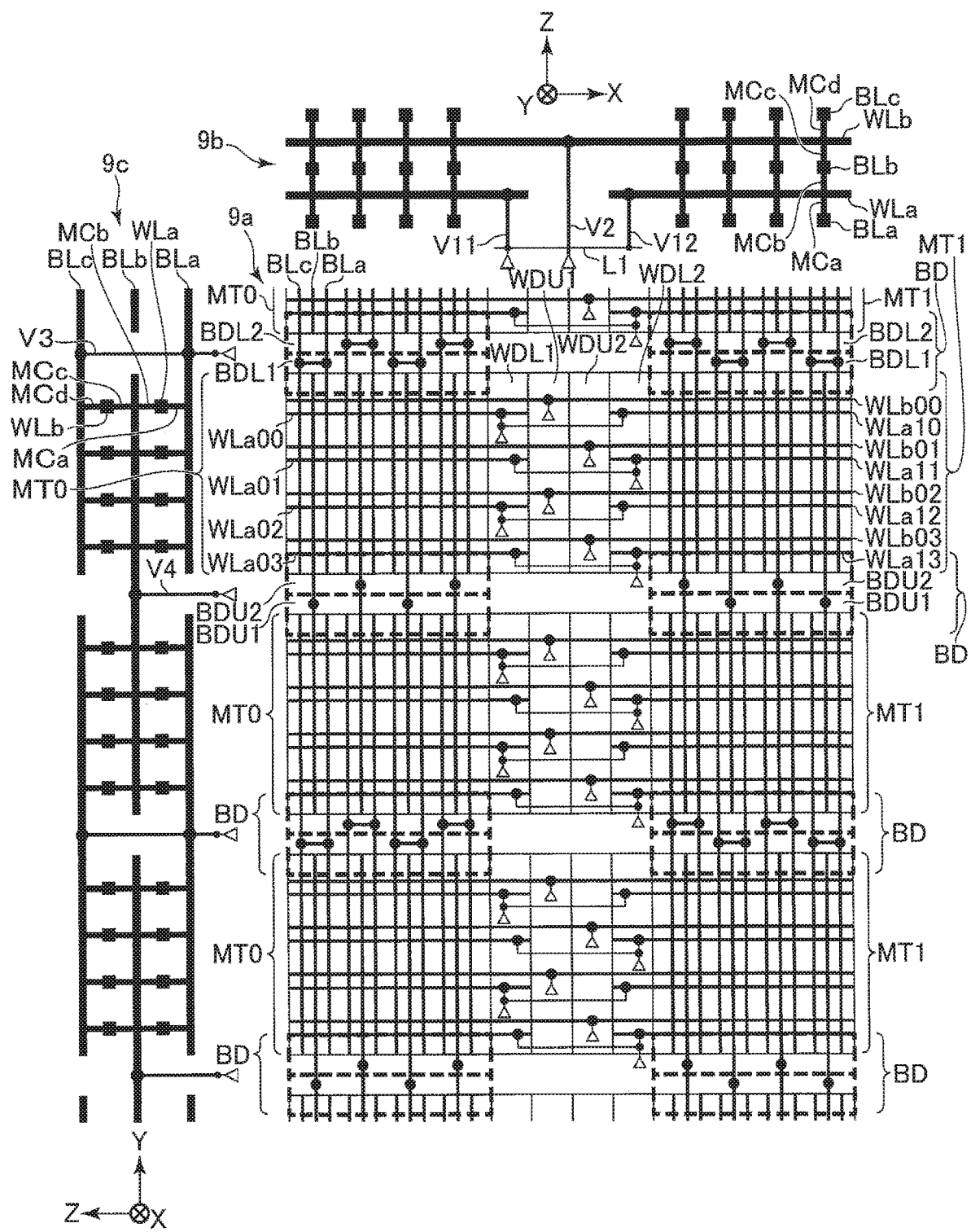
FIG. 9 is a drawing schematically showing an arrangement and couplings of word line drivers and bit line drivers in a first modification.

Next, a first modification of the first embodiment will be described with reference to FIG. 9. 9a in FIG. 9 is a drawing schematically showing an arrangement and couplings of word line drivers WD and bit line drivers BD in a first modification. 9b in FIG. 9 is a diagram of the word lines WL, the bit lines BL, and the word line drivers WD viewed from the Y direction. 9c in FIG. 9 is a diagram of the bit lines BL, the word lines WL, and the bit line drivers BD viewed from the X direction. In the above-described configuration shown in FIG. 7, the mats MT and the bit line drivers BD are arranged without being overlapped when viewed from the Z direction; however, in the first modification, as shown in 9a of FIG. 9, the mats MT and the bit line drivers BD are arranged with being overlapped when viewed from the Z direction. The other configuration is similar to that shown in FIG. 7. As for 9b and 9c of FIG. 9, similarly to 7b and 7c of FIG. 7, the width of the word line WL, the width of the bit line BL, and the dimensions of the memory cell MC are shown for explanation purposes only. As in FIGS. 3A and 3B, the X-direction or Y-direction dimension of the memory cell MC is approximately the same as, for example, the width of the bit line BL or word line WL coupled to the memory cell MC.

According to the first modification, it is possible to reduce an area required for forming the mats MT and the bit line drivers BD as compared to the area size required in the configuration shown in FIG. 7. It is thereby possible to reduce the chip size.

Figure 10:
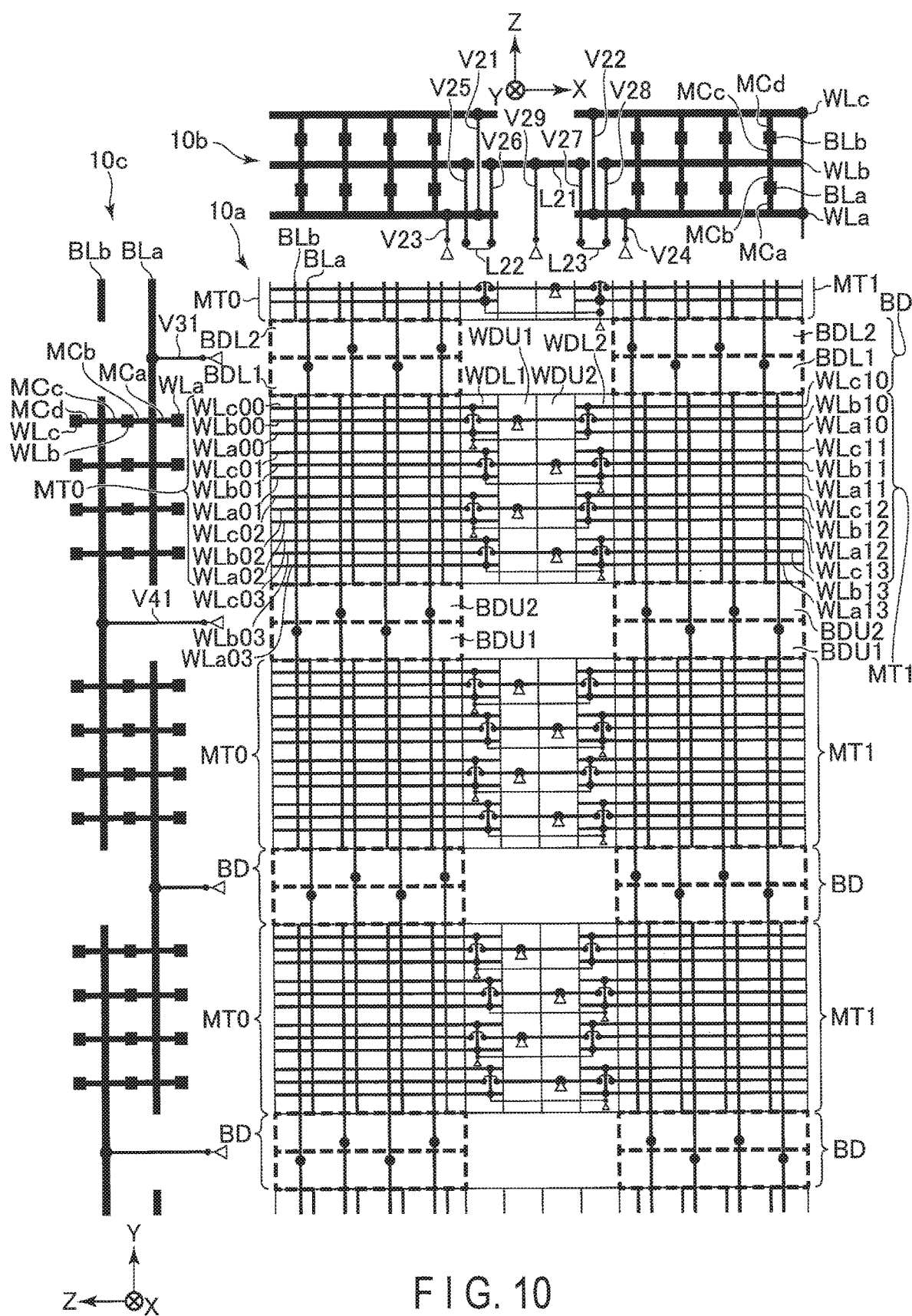
FIG. 10 is a drawing schematically showing an arrangement and couplings of word line drivers and bit line drivers in a second modification.

A second modification of the first embodiment will be described with reference to FIG. 10. The part "10a" in FIG. 10 is a drawing schematically showing an arrangement and couplings of word line drivers WD and bit line drivers BD in the second modification. The part "10b" in FIG. 10 is a diagram of the word lines WL, the bit lines BL, and the word line drivers WD viewed from the Y direction. The part "10c" in FIG. 10 is a diagram of the bit lines BL, the word lines WL, and the bit line drivers BD viewed from the X direction.

As for 10b and 10c of FIG. 10, similarly to 7b and 7c of FIG. 7, the width of the word line WL, the width of the bit line BL, and the dimensions of the memory cell MC are shown for explanation purposes only. As in FIGS. 3A and 3B, the X-direction or Y-direction dimension of the memory cell MC is approximately the same as, for example, the width of the bit line BL or word line WL coupled to the memory cell MC.

In the configuration shown in FIG. 7, four layers of memory cells are arranged between a set of three bit lines BLa through BLc and a set of two word lines WLa and WLb; in the second modification on the other hand, as shown in FIG. 10, four layers of memory cells are arranged between a set of two bit lines BLa and BLb and a set of three word lines WLa, WLb, and WLc.

In the mat MT0, a plurality of lower layer word lines WLa0, WLa01, WLa02, and WLa03, middle layer word lines WLb00, WLb01, WLb02, and WLb03, and upper layer word lines WLc00, WLc01, WLc02, and WLc03, are arranged. In the mat MT1, a plurality of lower layer word lines WLa10, WLa11, WLa12, and WLa13, middle layer word lines WLb10, WLb11, WLb12, and WLb13, and upper layer word lines WLc10, WLc11, WLc12, and WLc13, are arranged.

The lower layer word line WLa is arranged above the semiconductor substrate (or in the positive side of the Z direction). The middle layer word line WLb is arranged above the lower layer word line WLa. The upper layer word line WLc is arranged above the middle layer word line WLb.

Each of the lower layer word lines WLa00 through WLa03 extends in the X direction. The lower layer word lines WLa00 through WLa03 are aligned in the Y direction. Each of the middle layer word lines WLb00 through WLb03 extends in the X direction. The middle layer word lines WLb00 through WLb03 are aligned in the Y direction. Similarly, each of the upper layer word lines WLc00 through WLc03 extends in the X direction. The upper layer word lines WLc00 through WLc03 are aligned in the Y direction.

The lower layer word lines WLa00 through WLa03 aligned in the Y direction are alternately set at an even-numbered layer and an odd-numbered layer. Similarly, the upper layer word lines WLc00 through WLc03 aligned in the Y direction are alternately set at an even-numbered layer and an odd-numbered layer. The lower layer word line WLa0 and the upper layer word line WLc0 of the same even-numbered layer or the same odd-numbered layer are electrically connected via, for example, a via (or contact plug) V21.

Each of the lower layer word lines WLa10 through WLa13 extends in the X direction. The lower layer word lines WLa10 through WLa13 are aligned in the Y direction. Each of the middle layer word lines WLb10 through WLb13 extends in the X direction. The middle layer word lines WLb10 through WLb13 are aligned in the Y direction. Similarly, each of the upper layer word lines WLc10 through WLc13 extends in the X direction. The upper layer word lines WLc10 through WLc13 are aligned in the Y direction.

The lower layer word lines WLa10 through WLa13 aligned in the Y direction are alternately set at an even-numbered layer and an odd-numbered layer. Similarly, the upper layer word lines WLc10 through WLc13 aligned in the Y direction are alternately set at an even-numbered layer and an odd-numbered layer. The lower layer word line WLa1 and the upper layer word line WLc1 of the same even-numbered layer or the same odd-numbered layer are electrically connected via, for example, a via (or contact plug) V22.

The lower layer word line driver WDL1 is electrically coupled to the even-numbered lower layer word line WLa0 and the even-numbered upper layer word line WLc0 via vias V21 and V23. The lower layer word line driver WDL1 drives the even-numbered lower layer word lines WLa0 and the upper layer word line WLc0, in other words, applies a write voltage and a read voltage to the lower layer word lines WLa0 and the upper layer word line WLc0 at the time of a write operation and a read operation, respectively.

The lower layer word line driver WDL2 is electrically coupled to the even-numbered lower layer word line WLa1 and the even-numbered upper layer word line WLc1 via vias V22 and V24. The lower layer word line driver WDL2 drives the even-numbered lower layer word lines WLa1 and the upper layer word line WLc1, in other words, applies a write voltage and a read voltage to the lower layer word lines WLa1 and the upper layer word line WLc1 at the time of a write operation and read operation, respectively.

The middle layer word line WLb1 is formed on the same interconnect layer as the layer where the middle layer word line WLb0 exists. In other words, the middle layer word line WLb0 and the middle layer word line WLb1 are arranged at layers at the same height (or distance) from the surface of the semiconductor substrate.

The middle layer word lines WLb00 through WLb03 aligned in the Y direction are alternately set at an even-numbered layer and an odd-numbered layer. Similarly, the middle layer word lines WLb10 through WLb13 aligned in the Y direction are alternately set at an even-numbered layer and an odd-numbered layer. The middle layer word lines WLb0 and WLb1 of the same even-numbered layer or the same odd-numbered layer are electrically connected via, for example, the interconnect L21, the lower layer interconnect L22 and L23, and vias (or contact plugs) V25, V26, V27, V28, and V29.

The word line driver WDU1 is electrically coupled to the even-numbered middle layer word line WLb0 and the even-numbered middle layer word line WLb1 via the interconnects L21 through L23 and the vias V25 through V29. The word line driver WDU1 drives the even-numbered middle layer word lines WLb0 and WLb1, in other words, applies a write voltage and a read voltage to the middle layer word lines WLb0 and WLb1 at the time of a write operation and a read operation, respectively.

The word line driver WDU2 is electrically coupled to the odd-numbered middle layer word line WLb0 and the odd-numbered middle layer word line WLb1 via the interconnect L21 through L23 and the vias V25 through V29. The word line driver WDU2 drives the odd-numbered middle layer word lines WLb0 and WLb1, in other words, applies a write voltage and a read voltage to the middle layer word lines WLb0 and WLb1 at the time of a write operation and a read operation, respectively.

Between the mats MT0 and MT0 adjacently arranged in the Y direction and between the mats MT1 and MT1 adjacently arranged in the Y direction, the lower layer bit line drivers BDL1 and BDL2 or the upper layer bit line drivers BDU1 and BDU2 are arranged. The lower layer bit line drivers BDL1 and BDL2 and the upper layer bit line drivers BDU1 and BDU2 are aligned alternately between the mats MT0 and MT0 in the Y direction. Similarly, the lower layer bit line drivers BDL1 and BDL2 and the upper layer bit line drivers BDU1 or BDU2 are aligned alternately between the mats MT1 and MT1 in the Y direction.

A plurality of bit lines BLa are arranged above the word lines WLa. Each of the bit lines BLa extends in the Y direction. The plurality of bit lines BLa are aligned in the X direction. A plurality of bit lines BLb are arranged above the bit lines BLa. Each of the bit lines BLb extends in the Y direction. The plurality of bit lines BLb are aligned in the X direction.

The bit line BLa is shared between two adjacent mats MT, and arranged therebetween. Similarly, the bit line BLb is shared between two adjacent mats MT, and is arranged therebetween. A half of the bit line BLb is arranged in one of the two mats MT in which the bit line BLa is arranged, and the other half is arranged in the other of the two mats MT in which the bit line BLa is arranged.

The lower layer bit line drivers BDL1 and BDL2 are arranged between two mats MT in which the hit line BLa is arranged. The plurality of bit lines BLa aligned in the X direction are alternately set at an even-numbered layer and an odd-numbered layer.

The lower layer bit line driver BDL1 is electrically coupled to the even-numbered bit line BLa via a via (or contact plug) V31. The lower layer bit line driver BDL1 drives the even-numbered bit line BLa, in other words, applies a write voltage and a read voltage to the even-numbered bit line BLa at the time of a write operation and a read operation, respectively.

The lower layer bit line driver BDL2 is electrically coupled to the odd-numbered bit line BLa via the via (or contact plug) V31. The lower layer bit line driver BDL2 drives the odd-numbered bit line BLa, in other words, applies a write voltage and a read voltage to the odd-numbered bit line BLa at the time of a write operation and a read operation, respectively.

The upper layer bit line drivers BDU1 and BDU2 are arranged between two mats MT in which the bit line, BLb is arranged. The plurality of bit lines BLb aligned in the X direction are alternately set at an even-numbered layer and an odd-numbered layer.

The upper layer bit line driver BDU1 is electrically coupled to the even-numbered bit line BLb via the via (or contact plug) V41. The upper layer bit line driver BDU1 drives the even-numbered bit line BLb, in other words, applies a write voltage and a read voltage to the even-numbered bit line BLb at the time of a write operation and a read operation, respectively.

The upper layer bit line driver BDU2 is electrically coupled to the odd-numbered bit line BLb via the via (or contact plug) V41. The upper layer bit line driver BDU2 drives the odd-numbered bit line BLb, in other words, applies a write voltage and a read voltage to the odd-numbered bit line BLb at the time of a write operation and a read operation, respectively.

At the intersection of the word line and the bit line BLa, the memory cell MCa is arranged between the word line WLa and the bit line BLa. At the intersection of the bit line BLa and the word line WLb, the memory cell MCb is arranged between the bit line BLa and the word line WLb. At the intersection of the word line WLb and the bit line BLb, the memory cell MCc is arranged between the word line WLb and the bit line BLb. Further, at the intersection of the bit line BLb and the word line WLc, the memory cell. MCd is arranged between the bit line BLb and the word line WLc.

The advantageous effects which will be describe below can be achieved in the second modification with such a configuration.

1.6 Advantageous Effects

Figure 11:
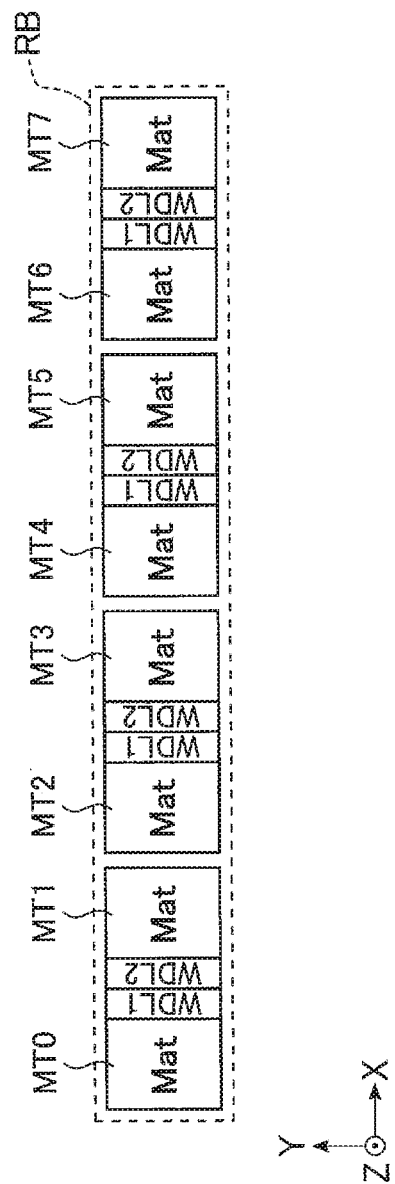
FIGS. 11 to 13 are drawings showing an arrangement of mats and word line drivers in a comparative example.
Figure 12:
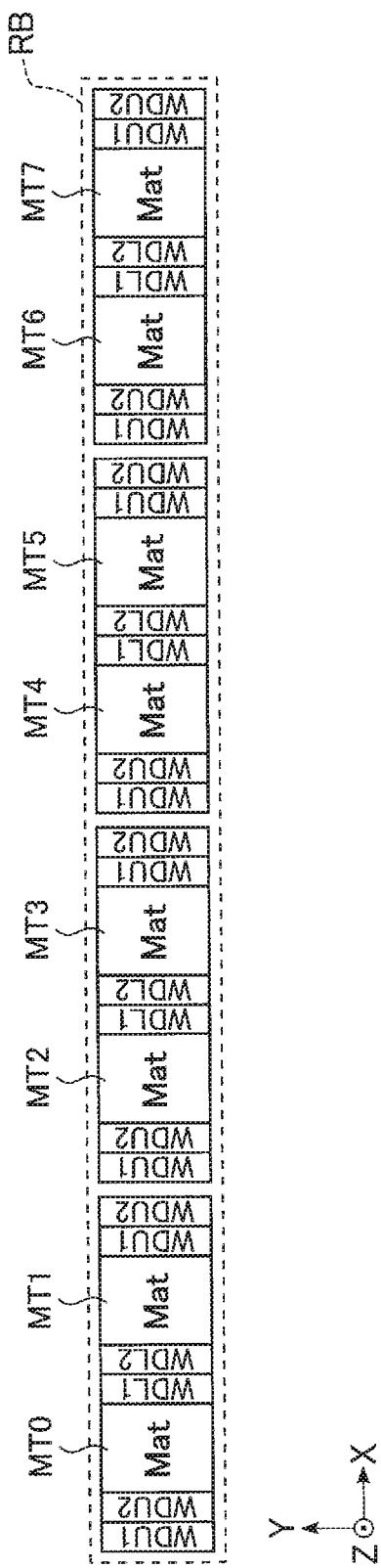
Figure 13:
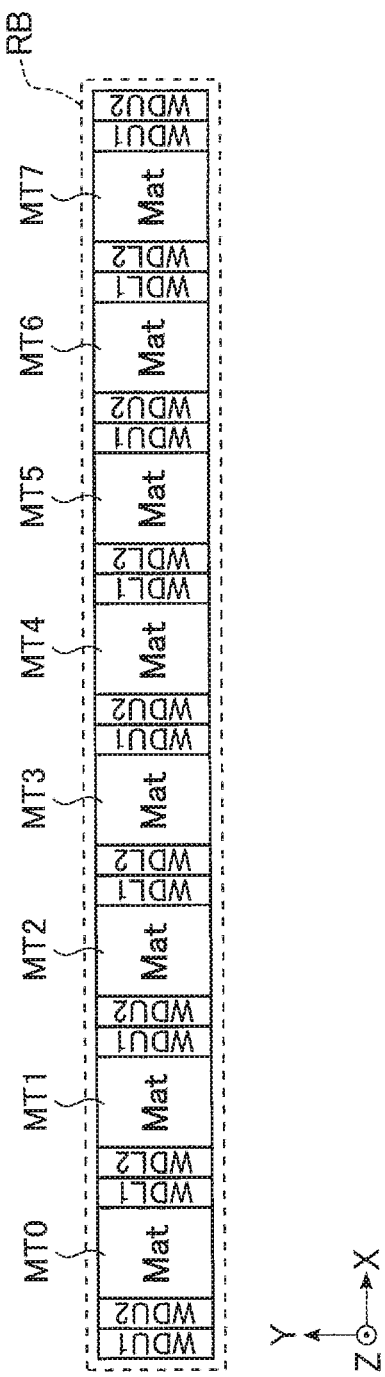

With the semiconductor memory device according to the first embodiment and the modification's thereof, it is possible to reduce a chip size. In the following, with reference to FIGS. 11, 12, and 13, an arrangement of the mats and the word line drivers will be described as a comparative example, and the advantageous effects of the present embodiment will also be described. FIGS. 11 to 13 are drawings showing an arrangement of the mats and the word line drivers in a comparative example.

FIG. 11 is a drawing showing an arrangement of the mats and the word line drivers in a case where the configuration includes the word lines WL arranged in a single interconnect layer, the bit lines BL arranged in two interconnect layers, and two layers of the memory cells MC arranged between these word lines WL and bit lines BL. Pairs of mats MT0 and MT1, MT2 and MT3, MT4 and MT5, and MT6 and MT7 respectively constitute a unit. The lower layer word line drivers WDL1 and WDL2 are arranged between the mats MT constituting a unit. The lower layer word line driver WDL1 drives the even-numbered word lines WL, and the lower layer word line driver WDL2 drives the odd-numbered word lines WL.

FIG. 12 is a drawing showing an arrangement of the mats and the word line drivers in a case where the configuration includes the word lines WL arranged in two interconnect layers, the bit lines BL arranged in three interconnect layers, and four layers of the memory cells MC arranged between these word lines WL and bit lines BL. Compared to the configuration shown in FIG. 11, since the word line is added to the configuration shown in FIG. 12, the upper layer word line drivers WDU1 and WDU2 that drive the word line added to the configuration shown in FIG. 12 are also added. The upper layer word line drivers WDU1 and WDU2 are arranged on both direction ends of the mat MT of each unit. For example, the upper layer word line driver WDU1 on the left end of the mat MT0 drives the even-numbered upper layer word line in the mat MT0. The upper layer word line driver WDU2 on the left end of the mat MT0 drives the odd-numbered upper layer word line in the mat MT0. The upper layer word line driver WDU1 on the right end of the mat MT1 drives the even-numbered upper layer word line in the mat MT1. Further, the upper layer word line driver WDU2 on the right end of the mat MT1 drives the odd-numbered upper layer word line in the mat MT1. Thus, in the configuration shown in FIG. 12, as the upper layer word line drivers WDU1 and WDU2 are arranged at both ends of the mats MT in each unit, an area necessary for arranging those elements increases.

FIG. 13 is, similarly to FIG. 12, a drawing showing an arrangement of the mats and the word line drivers in a case where the word lines WL are arranged in two interconnect layers, the bit lines BL are arranged in three interconnect layers, and four layers of the memory cells MC are arranged be these word lines WL and bit lines BL.

One of the differences in configuration between FIGS. 12 and 13 is that the upper layer word line drivers WDU1 and WDU2 arranged between adjacent units are shared between adjacent mats in the configuration of FIG. 13. In the configuration of FIG. 13, compared to the configuration of FIG. 12, three sets of the upper layer word line drivers WDU1 and WDU2 can be omitted, and an area required for arranging the upper layer word line drivers WDU1 and WDU2 can be thereby reduced.

Herein, in the configuration shown in FIG. 13, for example, the two upper layer word line drivers WDU1 and WDU2 arranged on the X-direction ends of the aligned mats MT0 through MT7 drive only the word lines WL in the mat MT0 or MT7, and are not shared between two mats MT. For this reason, there is room for improved efficiency in the upper layer word line drivers WDU1 and WDU2 arranged on both ends of the aligned mats MT0 through MT7.

In contrast, in the present embodiment, as shown in FIG. 6, the upper layer word line drivers WDLT1 and WDU2 are respectively arranged between the mats MT0 and MT1, MT2 and MT3, MT4 and MT5, and MT6 and MT7. In other words, the upper layer word line drivers WDU1 and WDU2 are arranged between the mats MT and between the lower layer word line drivers WDL1 and WDL2. It is thereby possible to more efficiently use the upper layer word line drivers WDU1 and WDU2 by sharing the upper layer word line drivers WDU1 and WDU2 in the two mats on both ends, the mats MT0 and MT1, and the mats MT6 and MT7. As a result, the number of upper layer word line drivers WDU1 and WDU2 arranged for the mats MT can be reduced, and an area required for arranging the upper layer word line drivers WDU1 and WDU2 can be reduced.

If six, eight, or more layers of memory cells MC are stacked in the Z direction, it is possible to arrange the drivers that drive the word lines WL (or bit lines BL) of a large number of interconnect layers between adjacent mats MT, and to reduce the number of the drivers arranged for the mats MT through sharing the drivers between adjacent mats MT. It is thereby possible to reduce an area required for arranging the drivers and to reduce the chip size.

In the first embodiment, if, for example, four layers of memory cells MC are stacked in the Z direction, it is possible to arrange the drivers that drive the word lines WL (or bit lines BL) of a large number of interconnect layers between adjacent mats MT, and to reduce the number of the drivers arranged for the mats MT through sharing the drivers between adjacent mats MT. It is thereby possible to reduce an area required for arranging the drivers and to reduce the chip size.

Furthermore, it is thereby possible to minimize a unit of activation of the mats MT in write and read operations through arranging all the drivers that drive the word lines WL (or bit lines BL) in two adjacent mats MT between these mats MT. In other words, the number of mats activated during write and read operations can be minimized. It is thereby possible to reduce consumption power in write and read operations.

As described above, according to the first embodiment, it is possible to provide a semiconductor memory device with a reduced chip size. In other words, according to the first embodiment, it is possible to reduce the size of the semiconductor memory device, in other words, to reduce the size of the semiconductor chip where the semiconductor memory device is provided.

2. Second Embodiment

Next, a semiconductor memory device according to a second embodiment will be explained. In the foregoing first embodiment, an example is shown where the memory cells MC are arranged in four layers in the Z direction; an arrangement of the mats MT and the word line drivers WD if six or eight layers of memory cells MC are arranged in the Z direction will be described in this second embodiment. The circuit configuration and the configuration of the memory cell array in the second embodiment are the same as those in the first embodiment. The explanation of the second embodiment will focus mainly on the points that differ from the first embodiment.

2.1 Arrangement of Word Line Drivers

Hereinafter, the arrangement of the mats MT and the word line drivers WD in the row block RB will be explained for each case of six layers of the memory cells MC and eight layers of the memory cells MC in the Z direction.

2.1.1 Case of Six Layers of Memory Cells MC

FIG. 14 is a drawing showing an arrangement of the mats MT and the word line drivers WD in a case of six layers of the memory cells MC.

If the memory cells MC are arranged in the Z direction in six layers, assuming that the lowermost interconnect layer is a bit line BL, the bit lines BL arranged in four interconnect layers and the word lines WL arranged in three interconnect layers are arranged alternately in the Z direction, and the memory cells MC are respectively arranged between the bit lines BL and the word lines WL. The word lines WL arranged in four interconnect layers and the bit lines BL arranged in three interconnect layers may be arranged alternately in the Z direction, and the memory cells MC may be respectively arranged between the word lines WL and the bit lines BL.

The bit line BL is provided in the first interconnect layer above the semiconductor substrate, and the first layer of memory cells MC is provided on the bit line BL. The lower layer word line WL is provided in the second interconnect layer on the first layer of memory cells MC, and the second layer of memory cells MC is provided on the lower layer word line WL. The bit line BL is provided in the third interconnect layer on the second layer of memory cells MC, and the third layer of memory cells MC is provided on the bit line BL. The middle layer word line WL is provided in the fourth interconnect layer on the third layer of memory cells MC, and the fourth layer of memory cells MC is provided on the middle layer word line WL. The bit line BL is provided in the fifth interconnect layer on the fourth layer of memory cells MC, and the fifth layer of memory cells MC is provided on the bit line BL. The upper layer word line WL is provided in the sixth interconnect layer on the fifth layer of memory cells MC, and the sixth layer of memory cells MC is provided on the upper layer word line WL. Further, the bit line BL is provided in the seventh interconnect layer on the sixth layer of memory cells MC.

As shown in FIG. 14, the mats MT0 through MT7 are aligned in order in the X direction. The word line driver WD is provided in correspondence to two mats MT constituting a unit. The word line driver WD includes the lower layer word line drivers WDL1 and WDL2, the middle layer word line drivers WDM1 and WDM2, and the upper layer word line drivers WDU1 and WDU2.

Between the mat MT0 and the mat MT1, the lower layer word line driver WDL1, the middle layer word line driver WDM1, the upper layer word line driver WDU1, the upper layer word line driver WDU2, the middle layer word line driver WDM2, and the lower layer word line driver WDL2 corresponding to the mats MT0 and MT1 are arranged.

The middle layer word line drivers WDM1 and WDM2 are arranged between the lower layer word line drivers WDL1 and WDL2. The upper layer word line drivers WDU1 and WDU2 are arranged between the middle layer word line drivers WDM1 and WDM2. In other words, between the mat MT0 and the mat MT1, the word line drivers WDL1, WDM1, WDU1, WDU2, WDM2, WDL2 are aligned in this order, from the mat MT0 toward the mat MT1.

The lower layer word line drivers WDL1 and WDL2 drive the lower layer word lines WL coupled to the memory cells MC of the mats MT0 and MT1. Specifically, for example, the lower layer word line driver WDL1 drive the even-numbered lower layer word lines WL coupled to the memory cells MC of the mats MT0 and MT1. The lower layer word line driver WDL2 drive the odd-numbered lower layer word lines WL coupled to the memory cells MC of the mats MT0 and MT1.

The middle layer word line drivers WDM1 and WDM2 drive the middle layer word lines WL coupled to the memory cells MC of the mats MT0 and MT1. Specifically, for example, the middle layer word line driver WDM1 drive the even-numbered middle layer word lines WL coupled to the memory cells MC of the mats MT0 and MT1. The middle layer word line driver WDM2 drive the odd-numbered middle layer word lines WL coupled to the memory cells MC of the mats MT0 and MT1.

Furthermore, the upper layer word line drivers WDU1 and WDU2 drive the upper layer word lines WL coupled to the memory cells MC of the mats MT0 and MT1. Specifically, for example, the upper layer word line driver WDU1 drive the even-numbered upper layer word lines WL coupled to the memory cells MC of the mats MT0 and MT1. The upper layer word line driver WDU2 drive the odd-numbered upper layer word lines WL coupled to the memory cells MC of the mats MT0 and MT1.

Between the mat MT2 and the mat MT3, the lower layer word line driver WDL1, the middle layer word line driver WDM1, the upper layer word line driver WDU1, the upper layer word line driver WDU2, the middle layer word line driver WDM2, and the lower layer word line driver WDL2 corresponding to the mats MT2 and MT3 are arranged. The middle layer word line drivers WDM1 and WDM2 are arranged between the lower layer word line drivers WDL1 and WDL2. The upper layer word line drivers WDU1 and WDU2 are arranged between the middle layer word line drivers WDM1 and WDM2. In other words, between the mat MT2 and the mat MT3, the word line drivers WDL1, WDM1, WDI31, WDU2, WDM2, WDL2 are aligned in this order, from the mat MT2 toward the mat MT3.

The lower layer word line drivers WDL1 and WDL2 between the mats MT2 and MT3 drive the even-numbered or odd-numbered lower layer word lines WL coupled to the memory cells MC of the mats MT2 and MT3. The middle layer word line drivers WDM1 and WDM2 between the mats MT2 and MT3 drive the even-numbered or odd-numbered middle layer word lines WL coupled to the memory cells MC of the mats MT2 and MT3. Further, the upper layer word line drivers WDU1 and WDU2 between the mats MT2 and MT3 drive the even-numbered or odd-numbered upper layer word lines WL coupled to the memory cells MC of the mats MT2 and MT3.

Between the mat MT4 and the mat MT5, the lower layer word line driver WDL1, the middle layer word line driver WDM1, the upper layer word line driver WDU1, the upper layer word line driver WDU2, the middle layer word line driver WDM2, and the lower layer word line driver WDL2 corresponding to the mats MT4 and MT5 are arranged. In other words, between the mat MT4 and the mat MT5, the word line drivers WDL1, WDM1, WDU1, WDU2, WDM2, WDL2 are aligned in this order, from the mat MT4 toward the mat MT5.

The lower layer word line drivers WDL1 and WDL2 between the mats MT4 and MT5 drive the even-numbered or odd-numbered lower layer word lines WL coupled to the memory cells MC of the mats MT4 and MT5. The middle layer word line drivers WDM1 and WDM2 between the mats MT4 and MT5 drive the even-numbered or odd-numbered middle layer word lines WL coupled to the memory cells MC of the mats MT4 and MT5. Further, the upper layer word line drivers WDU1 and WDU2 between the mats MT4 and MT5 drive the even-numbered or odd-numbered upper layer word lines WL coupled to the memory cells MC of the mats MT4 and MT5.

Between the mat MT6 and the mat MT7, the lower layer word line driver WDL1, the middle layer word line driver WDM1, the upper layer word line driver WDU1, the upper layer word line driver WDU2, the middle layer word line driver WDM2, and the lower layer word line driver WDL2 corresponding to the mats MT6 and MT7 are arranged. In other words, between the mat MT6 and the mat MT7, the word line drivers WDL1, WDM1, WDU1, WDU2, WDM2, WDL2 are aligned in this order, from the mat MT6 toward the mat MT7.

The lower layer word line drivers WDL1 and WDL2 between the mats MT6 and MT7 drive the even-numbered or odd-numbered lower layer word lines WL coupled to the memory cells MC of the mats MT6 and MT7. The middle layer word line drivers WDM1 and WDM2 between the mats MT6 and MT7 drive the even-numbered or odd-numbered middle layer word lines WL coupled to the memory cells MC of the mats MT6 and MT7. Further, the upper layer word line drivers WDU1 and WDU2 between the mats MT6 and MT7 drive the even-numbered or odd-numbered upper layer word lines WL coupled to the memory cells MC of the mats MT6 and MT7.

Figure 15:
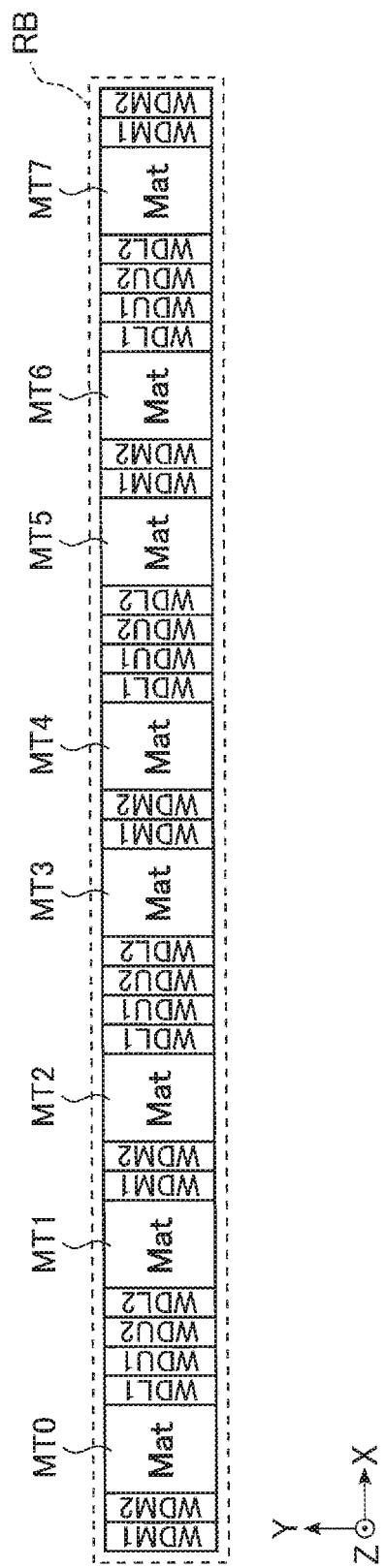
FIG. 15 is a drawing showing a second example of an arrangement of mats and word line drivers in the second embodiment.

Next, another example of the arrangement of the mats MT and the word line drivers WD will be explained. FIG. 15 is a drawing showing another example of the arrangement of the mats MT and the word line drivers WD in a case of six layers of the memory cells MC.

As shown in FIG. 15, the mats MT0 through MT7 are aligned in order in the X direction. The word line driver WD is provided in correspondence to two or a single mat MT.

Between the mat MT0 and the mat MT1, the lower layer word line driver WDL1, the upper layer word line driver WDU1, the upper layer word line driver WDU2, and the lower layer word line driver WDL2 corresponding to the mats MT0 and MT1 are arranged. The upper layer word line drivers WDU1 and WDU2 are arranged between the lower layer word line drivers WDL1 and WDL2. In other words, between the mat MT0 and the mat MT1, the word line drivers WDL1, WDU1, WDU2, and WDL2 are aligned in this order, from the mat MT0 toward the mat MT1.

In the mat MT0, on the side opposite to the side where the lower layer word line driver WDL1 is arranged, the middle layer word line drivers WDM1 and WDM2 corresponding to the mat MT0 are arranged. In other words, on the left side of the mat MT0 in FIG. 15, the middle layer word line drivers WDM1 and WDM2 corresponding to the mat MT0 are arranged. Further, the middle layer word line drivers WDM1 and WDM2 corresponding to the mats MT1 and MT2 are arranged between the mats MT1 and MT2.

The lower layer word line drivers WDL1 and WDL2 drive the even-numbered or odd-numbered lower layer word lines WL coupled to the memory cells MC of the mats MT0 and MT1. The upper layer word line drivers WDU1 and WDU2 drive the even-numbered or odd-numbered upper layer word lines WL coupled to the memory cells MC of the mats MT0 and MT1.

The middle layer word line drivers WDM1 and WDM2 arranged on the left side of the mat MT0 in FIG. 15 drive the even-numbered or odd-numbered middle layer word lines WL coupled to the memory cells MC of the mats MT0. The middle layer word line drivers WDM1 and WDM2 arranged between the mats MT1 and MT2 drive the even-numbered or odd-numbered middle layer word lines WL coupled to the memory cells MC of the mats MT1 and MT2.

Between the mat MT2 and the mat MT3, the lower layer word line driver WDL1, the upper layer word line driver WDU1, the upper layer word line driver WDU2, and the lower layer word line driver WDL2 corresponding to the mats MT2 and MT3 are arranged. The upper layer word line drivers WDU1 and WDU2 are arranged between the lower layer word line drivers WDL1 and WDL2. In other words, between the mat MT2 and the mat MT3, the word line drivers WDL1, WDU1, WDU2, and WDL2 are aligned in this order, from the mat MT2 toward the mat MT3. Further, the middle layer word line drivers WDM1 and WDM2 corresponding to the mats MT3 and MT4 are aligned between the mats MT3 and MT4.

The lower layer word line drivers WDL1 and WDL2 between the mats MT2 and MT3 drive the even-numbered or odd-numbered lower layer word lines WL coupled to the memory cells MC of the mats MT2 and MT3. The upper layer word line drivers WDU1 and WDU2 between the mats MT2 and MT3 drive the even-numbered or odd-numbered upper layer word lines WL coupled to the memory cells MC of the mats MT2 and MT3. Further, the middle layer word line drivers WDM1 and WDM2 between the mats MT3 and MT4 drive the even-numbered or odd-numbered middle layer word lines WL coupled to the memory cells MC of the mats MT3 and MT4.

Between the mat MT4 and the mat MT5, the lower layer word line driver WDL1, the upper layer word line driver WDU1, the upper layer word line driver WDU2, and the lower layer word line driver WDL2 corresponding to the mats MT4 and MT5 are arranged in other words, between the mats MT4 and MT5, the word line drivers WDL1, WDU2, and WDL2 are aligned in this order, from the mat MT4 toward the mat MT5. Further, the middle layer word line drivers WDM1 and WDM2 corresponding to the mats MT5 and MT6 are arranged between the mats MT5 and MT6.

The lower layer word line drivers WDL1 and WDL2 between the mats MT4 and MT5 drive the even-numbered or odd-numbered lower layer word lines WL coupled to the memory cells MC of the mats MT4 and MT5. The upper layer word line drivers WDU1 and WDU2 between the mats MT4 and MT5 drive the even-numbered or odd-numbered upper layer word lines WL coupled to the memory cells MC of the mats MT4 and MT5. Further, the middle layer word line drivers WDM1 and WDM2 between the mats MT5 and MT6 drive the even-numbered or odd-numbered middle layer word lines WL coupled to the memory cells MC of the mats MT5 and MT6.

Between the mat MT6 and the mat MT7, the lower layer word line driver WDL1, the upper layer word line driver WDU1, the upper layer word line driver WDU2, and the lower layer word line driver WDL2 corresponding to the mats MT6 and MT7 are arranged. In other words, between the mat MT6 and MT7, the word line drivers WDL1, WDU1, WDU2, and WDL2 are aligned in this order, from the mat MT6 toward the mat MT7. Further, in the mat MT7, on the side opposite to the side where the lower layer word line driver WDL2 is arranged, the middle layer word line drivers WDM1 and WDM2 corresponding to the mat MT7 are arranged. In other words, on the right side of the mat MT7 in FIG. 15, the middle layer word line drivers WDM1 and WDM2 corresponding to the mat MT7 are arranged.

The lower layer word line drivers WDL1 and WDL2 between the mats MT6 and MT7 drive the even-numbered or odd-numbered lower layer word lines WL coupled to the memory cells MC of the mats MT6 and MT7. The upper layer word line drivers WDU1 and WDU2 between the mats MT6 and MT7 drive the even-numbered or odd-numbered upper layer word lines WL coupled to the memory cells MC of the mats MT6 and MT7. The middle layer word line drivers WDM1 and WDM2 arranged on the right side of the mat MT7 in FIG. 15 drive the even-numbered or odd-numbered middle layer word lines WL coupled to the memory cells MC of the mat MT7.

2.1.2 Case of Eight Layers of Memory Cells MC

Figure 16:
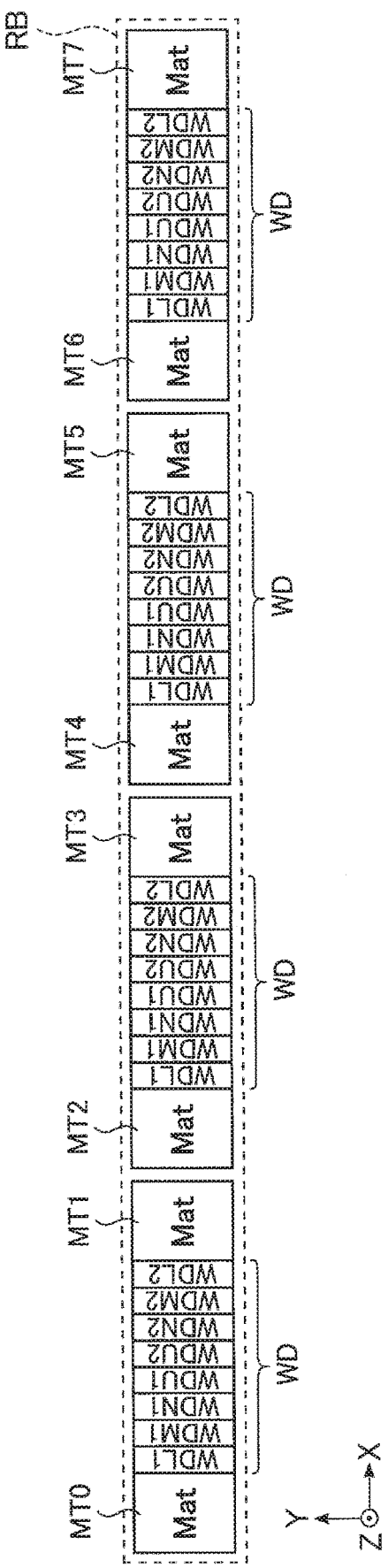
FIG. 16 is a drawing showing a third example of an arrangement of mats and word line drivers in the second embodiment.

FIG. 16 is a drawing showing an arrangement of the mats MT and the word line drivers WD in a case of eight layers the memory cells MC.

If the memory cells MC are arranged in the Z direction in eight layers, assuming that the lowermost interconnect layer is a bit line BL, the bit lines BL arranged in five interconnect layers and the word lines WL arranged in four interconnect layers are arranged alternately in the Z direction, and the memory cells MC are respectively arranged between the bit lines BL and the word lines WL. The word lines WL arranged in five interconnect layers and the bit lines BL arranged in four interconnect layers may be arranged alternately in the Z direction, and the memory cells MC may be respectively arranged between the word lines WL and the bit lines BL.

In the case of eight layers of memory cells MC, above the semiconductor substrate, in ascending order, the bit line BL of the first interconnect layer, the first layer of memory cells MC, the lower layer word line WL of the second interconnect layer, the second layer of the memory cells MC, the bit line BL of the third interconnect layer, the third layer of memory cells MC, the first middle layer word line WL of the fourth interconnect layer, the fourth layer of memory cells MC, the bit line BL of the fifth interconnect layer, the fifth layer of memory cells MC, the second middle layer word line WL of the sixth interconnect layer, the sixth layer of memory cells MC, the bit line BL of the seventh interconnect layer, the seventh layer of memory cells MC, the upper layer word line WL of the eighth interconnect layer, the eighth layer of memory cells MC, and the hit line BL of the ninth interconnect layer are arranged.

As shown in FIG. 16, the mats MT0 through MT7 are aligned in order in the X direction. The word line driver WD is provided in correspondence to two mats MT constituting a unit. The word line driver WD includes the lower layer word line drivers WDL1 and WDL2, the first middle layer word line drivers WDM1 and WDM2, the second middle layer word line drivers WDN1 and WDN2, and the upper layer word line drivers WDU1 and WDU2.

Between the mat MT0 and the mat MT1, the lower layer word. line driver WDL1, the first middle layer word line driver WDM1, the second middle layer word line driver WDN1, the upper layer word line driver WDU1, the upper layer word line driver WDU2, the second middle layer word line driver WDN2, the first middle layer word line driver WDM2, and the lower layer word line driver WDL2 corresponding to the mats MT0 and MT1 are arranged.

The first middle layer word line drivers WDM1 and WDM2 are arranged between the lower layer word line drivers WDL1 and WDL2. The second middle layer word line drivers WDN1 and WDN2 are arranged between the first middle layer word line drivers WDM1 and WDM2. The upper layer word line drivers WDU1 and WDU2 are arranged between the second middle layer word line drivers WDN1 and WDN2. In other words, between the mat MT0 and the mat MT1, the word line drivers WDL1, WDM1, WDN1, WDU1, WDU2, WDN2, WDM2, WDL2 are aligned in this order, from the mat MT0 toward the mat MT1.

The lower layer word line drivers WDL1 and WDL2 between the mats MT0 and MT1 drive the even-numbered or odd-numbered lower layer word lines WL coupled to the memory cells MC of the mats MT0 and MT1. The first middle layer word line drivers WDM1 and WDM2 between the mats MT0 and MT1 drive the even-numbered or odd-numbered first middle layer word lines WL coupled to the memory cells MC of the mats MT0 and MT1. The second middle layer word line drivers WDN1 and WDN2 between the mats MT0 and MT1 drive the even-numbered or odd-numbered second middle layer word lines WL coupled to the memory cells MC of the mats MT0 and MT1. Further, the upper layer word line drivers WDU1 and WDU2 between the mats MT0 and MT1 drive the even-numbered or odd-numbered upper layer word lines WL coupled to the memory cells MC of the mats MT0 and MT1.

Between the mat MT2 and the mat. MT3, the lower layer word line driver WDL1, the first middle layer word line driver WDM1, the second middle layer word line driver WDN1, the upper layer word line driver WDU1, the upper layer word line driver WDU2, the second middle layer word line driver WDN2, the first middle layer word line driver WDM2, and the lower layer word line driver WDL2 corresponding to the mats MT2 and MT3 are arranged. In other words, between the mat MT2 and MT3, the word line drivers WDL1, WDM1, WDN1, WDU1, WDU2, WDN2, WDM2, and WDL2 are aligned in this order, from the mat MT2 toward the mat MT3. The word lines WL in the mats MT2 and MT3 driven by these word line drivers WD are the same as in the above-described case of the mats MT0 and MT1.

Between the mat MT4 and the mat MT5, the lower layer word line driver WDL1, the first middle layer word line driver WDM1, the second middle layer word line driver WDN1, the upper layer word line driver WDU1, the Upper layer word line driver WDU2, the second middle layer word line driver WDN2, the first middle layer word line driver WDM2, and the lower layer word line driver WDL2 corresponding to the mats MT4 and MT5 are arranged. In other words, between the mat MT4 and MT5, the word line drivers WDL1, WDM1, WDN1, WDU1, WDU2, WDN2, WDM2, and WDL2 are aligned in this order, from the mat MT4 toward the mat MT5. The word lines WL in the mats MT4 and MT5 driven by these word line drivers WD are the same as in the above-described case of the mats MT0 and MT1.

Between the mat MT6 and the mat MT7, the lower layer word line driver WDL1, the first middle layer word line driver WDM1, the second middle layer word line driver WDN1, the upper layer word line driver WDU1, the upper layer word line driver WDU2, the second middle layer word line driver WDN2, the first middle layer word line driver WDM2, and the lower layer word line driver WDL2 corresponding to the mats MT6 and MT7 are arranged. In other words, between the mat MT6 and the mat MT7, the word line drivers WDL1, WDM1, WDN1, WDU1, WDU2, WDN2, WDM2, and WDL2 are aligned in this order, from the mat MT6 toward the mat MT7. The word lines WL in the mats MT6 and MT7 driven by these word line drivers WD are the same as in the above-described case of the mats MT0 and MT1.

Figure 17:
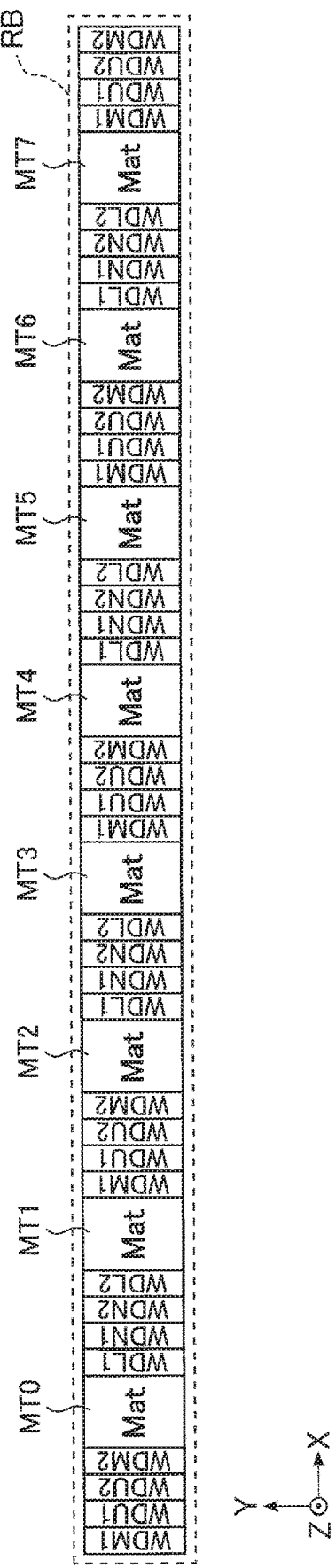
FIG. 17 is a drawing showing a fourth example of an arrangement of mats and word line drivers in the second embodiment.

Next, another example of the arrangement of the mats MT and the word line drivers WD will be explained. FIG. 17 is a drawing showing another example of the arrangement of the mats MT and the word line drivers WD in a case of eight layers of the memory cells MC.

As shown in FIG. 17, the mats MT0 through MT7 are aligned in order in the X direction. The word line driver WD is provided in correspondence to two or a single mat MT.

Between the mat MT0 and the mat MT1, the lower layer word line driver WDL1, the second middle layer word line driver WDN1, the second middle layer word line driver WDN2, and the lower layer word line driver WDL2 corresponding to the mats MT0 and MT1 are arranged. The second middle layer word line drivers WDN1 and WDN2 are arranged between the lower layer word line drivers WDL1 and WDL2. In other words, between the mat MT0 and the mat MT1, the word line drivers WDL1, WDN1, WDN2, and WDL2 are aligned in this order, from the mat MT0 toward the mat MT1.

In the mat MT0, on the side opposite to the side where the lower layer word line driver WDL1 is arranged, the first middle layer word line driver WDM1, the upper layer word line driver WDL1, the upper layer word line driver WDU2, and the first middle layer word line driver WDM2 corresponding to the mat MT0 are arranged. In other words, on the left side of the mat MT0 in FIG. 17, the word line drivers WDM1, WDU1, WDU2, WDM2 are aligned in this order, from the outer side toward the mat MT0.

Between the mat MT1 and the mat MT2, the first middle layer word line driver WDM1, the upper layer word line driver WDU1, the upper layer word line driver WDU2, and the first middle layer word line driver WDM2 corresponding to the mats MT1 and MT2 are arranged. The upper layer word line drivers WDU1 and WDU2 are arranged between the first middle layer word line drivers WDM1 and WDM2. In other words, between the mat MT1 and the mat MT2, the word line drivers WDM1, WDU1, WDU2, and WDM2 are aligned in this order, from the mat MT1 toward the mat MT2.

The lower layer word line drivers WDL1 and WDL2 between the mats MT0 and MT1 drive the even-numbered or odd-numbered lower layer word lines WL coupled to the memory cells MC of the mats MT0 and MT1. The second middle layer word line drivers WDN1 and WDN2 between the mats MT0 and MT1 drive the even-numbered or odd-numbered second middle layer word lines WL coupled to the memory MC of the mats MT0 and MT1.

The first middle layer word line drivers WDM1 and WDM2 arranged on the left side of the mat MT0 in FIG. 17 drive the even-numbered or odd-numbered first middle layer word lines WL coupled to the memory cells MC of the mat MT0. The upper layer word line drivers WDU1 and WDU2 arranged on the left side of the mat MT0 in FIG. 17 drive the even-numbered or odd-numbered upper layer word lines WL coupled to the memory cells MC of the mats MT0.

The first middle layer word line drivers WDM1 and WDM2 between the mats MT1 and MT2 drive the even-numbered or odd-numbered first middle layer word lines WL coupled to the memory cells MC of the mats MT1 and MT2. The upper layer word line drivers WDU1 and WDU2 between the mats MT1 and MT2 drive the even-numbered or odd-numbered upper layer word lines WL coupled to the memory cells MC of the mats MT1 and MT2.

Between the mat MT2 and the mat MT3, a lower layer word line driver WDL1, the second middle layer word line driver WDN1, the second middle layer word line driver WDN2, and the lower layer word line driver WDL2 corresponding to the mats MT2 and MT3 are arranged. The second middle layer word line drivers WDN1 and WDN2 are arranged between the lower layer word line drivers WDL1 and WDL2. In other words, between the mat MT2 and the mat MT3, the word line drivers WDL1, WDN1, WDN2, and WDL2 are aligned in this order, from the mat MT2 toward the mat MT3.

The lower layer word line drivers WDL1 and WDL2 between the mats MT2 and MT3 drive the even-numbered or odd-numbered lower layer word lines WL coupled to the memory cells MC of the mats MT2 and MT3. The second middle layer word line drivers WDN1 and WDN2 between the mats MT2 and MT3 drive the even-numbered or odd-numbered second middle layer word lines WL coupled to the memory cells MC of the mats MT2 and MT3.

Between the mat MT3 and the mat MT4, the first middle layer word line driver WDM1, the upper layer word line driver WDU1, the upper layer word line driver WDU2, and the first middle layer word line driver WDM2 corresponding to the mats MT3 and MT4 are arranged. The upper layer word line drivers WDU1 and WDU2 are arranged between the first middle layer word line drivers WDM1 and WDM2. In other words, between the mat MT3 and the mat MT4, the word line drivers WDM1, WDU1, WDU2, and WDM2 are aligned in this order, from the, mat MT3 toward the mat MT4.

The first middle layer word line drivers WDM1 and WDM2 between the mats MT3 and MT4 drive the even-numbered or odd-numbered first middle layer word lines WL coupled to the memory cells MC of the mats MT3 and MT4. The upper layer word line drivers WDU1 and WDU2 between the mats MT3 and MT4 drive the even-numbered or odd-numbered upper layer word lines WL coupled to the memory cells MC of the mats MT3 and MT4.

Between the mat MT4 and the mat MT5, the lower layer word line driver WDL1, the second middle layer word line driver WDN1, the second middle layer word line driver WDN2 and the lower layer word line driver WDL2 corresponding to the mats MT4 and MT5 are arranged. The second middle layer word line drivers WDN1 and WDN2 are arranged between the lower layer word line drivers WDL1 and WDL2. In other words, between the mat MT4 and the mat MT5, the word line drivers WDL1, WDN1, WDN2, and WDL2 are aligned in this order from the mat MT4 toward the mat MT5.

The lower layer word line drivers WDL1 and WDL2 between the mats MT4 and MT5 drive the even-numbered or odd-numbered lower layer word lines WL coupled to the memory cells MC of the mats MT4 and MT5. The second middle layer word line drivers WDN1 and WDN2 between the mats MT4 and MT5 drive the even-numbered or odd-numbered second middle layer word lines WL coupled to the memory cells MC of the mats MT4 and MT5.

Between the mat MT5 and the mat MT6, the first middle layer word line driver WDM1, the upper layer word line driver WDU1, the upper layer word line driver WDU2, and the first middle layer word line driver WDM2 corresponding to the mats MT5 and MT6 are arranged. The upper layer word line drivers WDU1 and WDU2 are arranged between the first middle layer word line drivers WDM1 and WDM2. In other words, between the mat MT5 and the mat MT6, the word line drivers WDM1, WDU1, WDU2, and WDM2 are aligned in this order, from the mat MT5 toward the mat MT6.

The first middle layer word line drivers WDM1 and WDM2 between the mats MT5 and MT6 drive the even-numbered or odd-numbered first middle layer word lines WL coupled to the memory cells MC of the mats MT5 and MT6. The upper layer word line drivers WDU1 and WDU2 between the mats MT5 and MT6 drive the even-numbered or odd-numbered upper layer word lines WL coupled to the memory cells MC of the mats MT5 and MT6.

Between the mat MT6 and the mat MT7, the lower layer word line driver WDL1, the second middle layer word line driver WDN1, the second middle layer word line driver WDN2, and the lower layer word line driver WDL2 corresponding to the mats MT6 and MT7 are arranged. The second middle layer word line drivers WDN1 and WDN2 are arranged between the lower layer word line drivers WDL1 and WDL2. In other words, between the mat MT6 and the mat MT7, the word line drivers WDL1, WDN1, WDN2, and WDL2 are aligned in this order, from the mat MT6 toward the mat MT7.

The lower layer word line drivers WDL1 and WDL2 between the mats MT6 and MT7 drive the even-numbered or odd-numbered lower layer word lines WL coupled to the memory cells MC of the mats MT6 and MT7. The second middle layer word line drivers WDN1 and WDN2 between the mats MT6 and MT7 drive the even-numbered or odd-numbered second middle layer word lines WL coupled to the memory cells MC of the mats MT6 and MT7.

In the mat MT7, on the side opposite to the side where the lower layer word line driver WDL2 is arranged, the first middle layer word line driver WDM1, the upper layer word line driver WDU1, the upper layer word line driver WDU2, and the first middle layer word line driver WDM2 corresponding to the mat MT7 are arranged. The upper layer word line drivers WDU1 and WDU2 are arranged between the first middle layer word line drivers WDM1 and WDM2. In other words, on the right side of the mat MT7 in FIG. 17, the word line drivers WDM1, WDU1, WDU2, and WDM2 are arranged in this order, from the mat MT7 toward the outer side.

The first middle layer word line drivers WDM1 and WDM2 arranged on the right side of the mat MT7 in FIG. 17 drive the even-numbered or odd-numbered first middle layer word lines WL coupled to the memory cells MC of the mats MT7. The upper layer word line drivers WDU1 and WDU2 arranged on the right side of the mat MT7 in FIG. 17 drive the even-numbered or odd-numbered upper layer word lines WL coupled to the memory cells MC of the mat MT7.

2.2 Advantageous Effects

With the semiconductor memory device according to the second embodiment, it is possible to reduce a chip size, similarly the first embodiment. In other words, it is possible to reduce the size of the semiconductor memory device, in other words, to reduce the size of the semiconductor chip where the semiconductor memory device is provided.

As shown in FIGS. 14 through 17, if six or eight (or more) layers of memory cells MC are stacked in the Z direction, it, is possible to arrange the drivers that drive the word lines WL (or bit lines BL) arranged in a large number of interconnect layers between adjacent mats, and to reduce the number of the drivers arranged for the mats MT through sharing the drivers between adjacent mats MT. It is thereby possible to reduce an area required for arranging the drivers and to reduce the chip size. Other advantageous effects are the same as in the foregoing first embodiment.

In the above-described embodiment, a resistance change type memory has been described as an example of the semiconductor memory device; however, the embodiment is not limited to such a resistance change type memory, and is applicable to other semiconductor memories in general. Furthermore, the present embodiment is applicable to various memory devices other than a semiconductor memory.

While certain embodiments have been described, these embodiments have been presented by way of example only, and are not intended to limit the scope of the inventions. These embodiments may be implemented in various other forms, and various omissions, replacements, and changes can be made without departing from the gist of the invention. The accompanying claims and their equivalents are intended to cover such forms or modifications as would fall within the scope, and spirit of the invention.

What is claimed is:

1. A semiconductor memory device comprising:
   a substrate including a main surface extending in a first direction and a second direction that intersects the first direction;
   a first memory cell array including a first conductive layer, a second conductive layer, a third conductive layer, a first memory cell, and a second memory cell, wherein,
      the first conductive layer is arranged on one side of a third direction that intersects the first direction and the second direction of the substrate, and extends in the first direction,
      the second conductive layer is arranged on the one side of the third direction of the first conductive layer and extends in the second direction,
      the third conductive layer is arranged on the one side of the third direction of the second conductive layer and extends in the first direction,
      the first memory cell is arranged between the first conductive layer and the second conductive layer with respect to the third direction, and
      the second memory cell is arranged between the second conductive layer and the third conductive layer with respect to the third direction;
   a second memory cell array including a fourth conductive layer, a fifth conductive layer, a sixth conductive layer, a third memory cell, and a fourth memory cell, wherein
      the fourth conductive layer is arranged on the one side of the third direction of the substrate and extends in the first direction,
      the fifth conductive layer is arranged on the one side of the third direction of the fourth conductive layer and extends in the second direction,
      the sixth conductive layer is arranged on the one side of the third direction of the fifth conductive layer and extends in the first direction,
      the third memory cell is arranged between the fourth conductive layer and the fifth conductive layer with respect to the third direction, and
      the fourth memory cell is arranged between the fifth conductive layer and the sixth conductive layer with respect to the third direction;
   a first driver that applies a voltage to the first conductive layer and the fourth conductive layer;
   a second driver that applies a voltage to the third conductive layer and the sixth conductive layer;
   a first connection arranged between the first memory cell array and the second memory cell array with respect to the first direction, and extending in the third direction, the first connection electrically coupling the first conductive layer and the fourth conductive layer to the first driver; and
   a second connection arranged between the first memory cell array and the second memory cell array with respect to the first direction, and extending in the third direction, the second connection electrically coupling the third conductive layer and the sixth conductive layer to the second driver.

2. The semiconductor memory device according to claim 1, wherein
   the first driver and the second driver are arranged between the first memory cell array and the second memory cell array with respect to the first direction.

3. The semiconductor memory device according to claim 1, wherein
   a plurality of each of the first conductive layer, the third conductive layer, the fourth conductive layer, and the sixth conductive layer are provided,
   the first driver includes a first subdriver and a second subdriver, and the first subdriver is electrically coupled to a part of the first conductive layer and a part of the fourth conductive layer, and the second subdriver is electrically coupled to another part of the first conductive layer and another part of the fourth conductive layer,
   the second driver includes a third subdriver and a fourth subdriver, and the third subdriver is electrically coupled to a part of the third conductive layer and a part of the sixth conductive layer, and the fourth subdriver is electrically coupled to another part of the third conductive layer and another part of the sixth conductive layer,
   in the first direction, the third subdriver and the fourth subdriver are arranged between the first subdriver and the second subdriver.

4. The semiconductor memory device according to claim 1, wherein
   the first memory cell array includes a seventh conductive layer, an eighth conductive layer, a fifth memory cell, and a sixth memory cell,
      the seventh conductive layer is arranged between the substrate and the first conductive layer with respect to the third direction and extends in the second direction,
      the eighth conductive layer is arranged on the one side of the third direction of the third conductive layer and extends in the second direction,
      the fifth memory cell is arranged between the seventh conductive layer and the first conductive layer with respect to the third direction, and
      the sixth memory cell is arranged between the third conductive layer and the eighth conductive layer with respect to the third direction,
   the second memory cell array includes a ninth conductive layer, a tenth conductive layer, a seventh memory cell, and an eighth memory cell, the ninth conductive layer is arranged between the substrate and the fourth conductive layer with respect to the third direction and extends in the second direction, the tenth conductive layer is arranged on the one side of the third direction of the sixth conductive layer and extends in the second direction, the seventh memory cell is arranged between the ninth conductive layer and the fourth conductive layer with respect to the third direction, and the eighth memory cell is arranged between the sixth conductive layer and the tenth conductive layer with respect to the third direction.

5. The semiconductor memory device according to claim 1, wherein the first memory cell array includes a seventh conductive layer, an eighth conductive layer, a ninth conductive layer, a tenth conductive layer, a fifth memory cell, a sixth memory cell, a seventh memory cell, and an eighth memory cell, the seventh conductive layer is arranged between the substrate and the first conductive layer with respect to the third direction and extends in the second direction, the eighth conductive layer is arranged between the second conductive layer and the third conductive layer with respect to the third direction and extends in the first direction, the ninth conductive layer is arranged between the eighth conductive layer and the third conductive layer with respect to the third direction and extends in the second direction, the tenth conductive layer is arranged on the one side of the third direction of the third conductive layer and extends in the second direction, the fifth memory cell is arranged between the seventh conductive layer and the first conductive layer with respect to the third direction, the sixth memory cell is arranged between the second conductive layer and the eighth conductive layer with respect to the third direction, the seventh memory cell is arranged between the eighth conductive layer and the ninth conductive layer with respect, to the third direction, the eighth memory cell is arranged between the third conductive layer and the tenth conductive layer with respect to the third direction, and the second memory cell is arranged between the ninth conductive layer and the third conductive layer with respect to the third direction, the second memory cell array includes an 11th conductive layer, a 12th conductive layer, a 13th conductive layer, a 14th conductive layer, a ninth memory cell, a tenth memory cell, an 11th memory cell, and a 12th memory cell, the 11th conductive layer is arranged between the substrate and the fourth conductive layer with respect to the third direction and extends in the second direction, the 12th conductive layer is arranged between the fifth conductive layer and the sixth conductive layer with respect to the third direction and extends in the first direction, the 13th conductive layer is arranged between the 12th conductive layer and the sixth conductive layer with respect to the third direction and extends in the second direction, the 14th conductive layer is arranged on the one side of the third direction of the sixth conductive layer and extends in the second direction, the ninth memory cell is arranged between the 11th conductive layer and the fourth conductive layer with respect to the third direction, the tenth memory cell is arranged between the fifth conductive layer and the 12th conductive layer with respect to the third direction, the 11th memory cell is arranged between the 12th conductive layer and the 13th conductive layer with respect to the third direction, the 12th memory cell is arranged between the sixth conductive layer and the 14th conductive layer with respect to the third direction, and the fourth memory cell is arranged between the 13th conductive layer and the sixth conductive layer with respect to the third direction, and further comprising a third driver arranged between the first memory cell array and the second memory cell array with respect to the first direction, and which applies a voltage to the eighth conductive layer and the 12th conductive layer.

6. The semiconductor memory device according to claim 3, wherein the first memory cell array includes a seventh conductive layer, an eighth conductive layer, a ninth conductive layer, a tenth conductive layer, a fifth memory cell, a sixth memory cell, a seventh memory cell, and an eighth memory cell, the seventh conductive layer is arranged between the substrate and the first conductive layer with respect to the third direction and extends in the second direction, the eighth conductive layer is arranged between the second conductive layer and the third conductive layer with respect to third direction and extends in the first direction, the ninth conductive layer is arranged between the eighth conductive layer and the third conductive layer with respect to the third direction and extends in the second direction, the tenth conductive layer is arranged on the one side of the third direction of the third conductive layer and extends in the second direction, the fifth memory cell is arranged between the seventh conductive layer and the first conductive layer with respect to the third direction, the sixth memory cell is arranged between the second conductive layer and the eighth conductive layer with respect to the third direction, the seventh memory cell is arranged between the eighth conductive layer and the ninth conductive layer with respect to the third direction the eighth memory cell arranged between the third conductive layer and the tenth conductive layer with respect to the third direction, and the second memory cell arranged between the ninth conductive layer and the third conductive layer with respect to the third direction, the second memory cell array includes an 11th conductive layer, a 12th conductive layer, a 13th conductive layer, a 14th conductive layer, a ninth memory cell, a tenth memory cell, an 11th memory cell, and a 12th memory cell, the 11th conductive layer is arranged between the substrate and the fourth conductive layer with respect to the third direction and extends in the second direction,
the 12th conductive layer is arranged between the fifth conductive layer and the sixth conductive layer with respect to the third direction and extends in the first direction,
the 13th conductive layer is arranged between the 12th conductive layer and the sixth conductive layer with respect to the third direction and extends in the second direction,
the 14th conductive layer is arranged on the one side of the third direction of the sixth conductive layer and extends in the second direction,
the ninth memory cell is arranged between the 11th conductive layer and the fourth conductive layer with respect to the third direction,
the 10th memory cell is arranged between the fifth conductive layer and the 12th conductive layer with respect to the third direction,
the 11th memory cell is arranged between the 12th conductive layer and the 13th conductive layer with respect to the third direction,
the 12th memory cell is arranged between the sixth conductive layer and the 14th conductive layer with respect to the third direction, and
the fourth memory cell is arranged between the 13th conductive layer and the sixth conductive layer with respect to the third direction,
further comprising a third driver arranged between the first memory cell array and the second memory cell array with respect to the first direction, and which applies a voltage to the eighth conductive layer and the 12th conductive layer, wherein
the third driver includes a fifth subdriver and a sixth subdriver, and
the fifth subdriver and the sixth subdriver are arranged between the first subdriver and the second subdriver with respect to the first direction.

7. The semiconductor memory device according to claim 1, wherein
the first memory cell array includes a seventh conductive layer, an eighth conductive layer, a ninth conductive layer, a tenth conductive layer, a fifth memory cell, a sixth memory cell, a seventh memory cell, and an eighth memory cell,
the seventh conductive layer is arranged between the substrate and the first conductive layer with respect to the third direction and extends in the second direction,
the eighth conductive layer is arranged between the second conductive layer and the third conductive layer with respect to the third direction and extends in the first direction,
the ninth conductive layer is arranged between the eighth conductive layer and the third conductive layer with respect to the third direction and extends in the second direction,
the tenth conductive layer is arranged on the one side of the third direction of the third conductive layer and extends in the second direction,
the fifth memory cell is arranged between the first conductive layer and the seventh conductive layer with respect to the third direction,
the sixth memory cell is arranged between the second conductive layer and the eighth conductive layer with respect to the third direction,
the seventh memory cell is arranged between the eighth conductive layer and the ninth conductive layer with respect to the third direction,
the eighth memory cell is arranged between the third conductive layer and the tenth conductive layer with respect to the third direction, and
the second memory cell is arranged between the ninth conductive layer and the third conductive layer with respect to the third direction,
the second memory cell array includes an 11th conductive layer, a 12th conductive layer, a 13th conductive layer, a 14th conductive layer, a ninth memory cell, a tenth memory cell, an 11th memory cell, and a 12th memory cell,
the 11th conductive layer is arranged between the substrate and the fourth conductive layer with respect to the third direction and extends in the second direction,
the 12th conductive layer is arranged between the fifth conductive layer and the sixth conductive layer with respect to the third direction and extends in the first direction,
the 13th conductive layer is arranged between the 12th conductive layer and the sixth conductive layer with respect to the third direction and extends in the second direction,
the 14th conductive layer is arranged on the one side of the third direction of the sixth conductive layer and extends in the second direction,
the ninth memory cell is arranged between the 11th conductive layer and the fourth conductive layer with respect to the third direction,
the tenth memory cell is arranged between the fifth conductive layer and the 12th conductive layer with respect to the third direction,
the 11th memory cell is arranged between the 12th conductive layer and the 13th conductive layer with respect to the third direction,
the 12th memory cell is arranged between the sixth conductive layer and the 14th conductive layer with respect to the third direction, and
the fourth memory cell is arranged between the 13th conductive layer and the sixth conductive layer with respect to the third direction, and
further comprising a third driver arranged on a side opposite to a side where the first connection of the first memory cell array with respect to the first direction is arranged, and which applies a voltage to the eighth conductive layer and the 12th conductive layer.

8. The semiconductor memory device according to claim 5, wherein
the first memory cell array includes a 15th conductive layer, a 16th conductive layer, a 13th memory cell, and a 14th memory cell,
the 15th conductive layer is arranged on the one side of the third direction of the eighth conductive layer and extends in the first direction,
the 16th conductive layer is arranged on the one side of the third direction of the 15th conductive layer and extends in the second direction,
the 13th memory cell is arranged between the eighth conductive layer and the 15th conductive layer with respect to the third direction, and the 14th memory cell is arranged between the 15th conductive layer and the 16th conductive layer with respect to the third direction, the first memory cell array includes a 17th conductive layer, an 18th conductive layer, a 15th memory cell, and a 16th memory cell, the 17th conductive layer is arranged on the one side of the third direction of the 14th conductive layer and extends in the first direction, the 18th conductive layer is arranged on the one side of the third direction of the 17th conductive layer and extends in the second direction, the 15th memory cell is arranged between the 14th conductive layer and the 17th conductive layer with respect to the third direction, and the 16th memory cell is arranged between the 17th conductive layer and the 18th conductive layer with respect to the third direction, and further comprising a fourth driver arranged between the first memory cell array and the second memory cell array with respect to the first direction, and which applies a voltage to the 15th conductive layer and the 17th conductive layer.

9. The semiconductor memory device according to claim 6, wherein the first memory cell array includes a 15th conductive layer, a 16th conductive layer, a 13th memory cell, and a 14th memory cell, the 15th conductive layer is arranged on the one side of the third direction of the eighth conductive layer and extends in the first direction, the 16th conductive layer is arranged on the one side of the third direction of the 15th conductive layer and extends in the second direction, the 13th memory cell is arranged between the eighth conductive layer and the 15th conductive layer with respect to the third direction, and the 14th memory cell is arranged between the 15th conductive layer and the 16th conductive layer with respect to the third direction, the first memory cell array includes a 17th conductive layer, an 18th conductive layer, a 15th memory cell, and a 16th memory cell, the 17th conductive layer is arranged on the one side of the third direction of the 14th conductive layer and extends in the first direction, the 18th conductive layer is arranged on the one side of the third direction of the 17th conductive layer and extends in the second direction, the 15th memory cell is arranged between the 14th conductive layer and the 17th conductive layer with respect to the third direction, and the 16th memory cell is arranged between the 17th conductive layer and the 18th conductive layer with respect to the third direction, further comprising a fourth driver arranged between the first memory cell array and the second memory cell array with respect to the first direction, and which applies a voltage to the 15th conductive layer and the 17th conductive layer, wherein the fourth driver includes a seventh subdriver and an eighth subdriver, the seventh subdriver and the eighth subdriver are arranged between the first subdriver and the second subdriver with respect to the first direction.

10. The semiconductor memory device according to claim 7, wherein the first memory cell array includes a 15th conductive layer, a 16th conductive layer, a 13th memory cell, and a 14th memory cell, the 15th conductive layer is arranged on the one side of the third direction of the eighth conductive layer and extends in the first direction, the 16th conductive layer is arranged on the one side of the third direction of the 15th conductive layer and extends in the second direction, the 13th memory cell is arranged between the eighth conductive layer and the 15th conductive layer with respect to the third direction, and the 14th memory cell is arranged between the 15th conductive layer and the 16th conductive layer with respect to the third direction, and the first memory cell array includes a 17th conductive layer, an 18th conductive layer, a 15th memory cell, and a 16th memory cell, the 17th conductive layer is arranged on the one side of the third direction of the 14th conductive layer and extends in the first direction, the 18th conductive layer is arranged on the one side of the third direction of the 17th conductive layer and extends in the second direction, the 15th memory cell is arranged between the 14th conductive layer and the 17th conductive layer with respect to the third direction, and the 16th memory cell is arranged between the 17th conductive layer and the 18th conductive layer with respect to the third direction, and further comprising a fourth driver arranged on a side opposite to a side where the first connection of the first memory cell array with respect to the first direction, and which applies a voltage to the 15th conductive layer and the 17th conductive layer.

11. The semiconductor memory device according to claim 1, wherein the first conductive layer and the fourth conductive layer are electrically coupled to the substrate with respect to the third direction via a first interconnect layer arranged between the first conductive layer and the fourth conductive layer.

12. The semiconductor memory device according to claim 1, wherein a part of the first memory cell array overlaps the first driver when viewed from the third direction.

13. The semiconductor memory device according to claim 1, further comprising a third driver arranged on one side of the second direction of the first memory cell array, and which applies a voltage to the second conductive layer.

14. The semiconductor memory device according to claim 1, wherein the first connection is a via including a conductor.

15. The semiconductor memory device according to claim 1, wherein the first connection is a contact including a conductor.

16. The semiconductor memory device according to claim 1, wherein the first conductive layer and the fourth conductive layer are arranged on approximately a straight line, and the third conductive layer and the sixth conductive layer are arranged on approximately a straight line.

* * * * *